United States Patent
Schutte et al.

(10) Patent No.: US 8,152,452 B2
(45) Date of Patent: Apr. 10, 2012

(54) COMPUTER ROOM ENVIRONMENTAL CONDITIONING UNIT WITH TRANSLATABLE BLOWERS

(75) Inventors: Daniel J. Schutte, Lewis Center, OH (US); Gary A. Helmink, Galloway, OH (US); David W. Douglas, Cardington, OH (US); Benedict J. Dolcich, Westerville, OH (US); Anfu Zhong, Shenzhen (CN); Gang Xu, Shenzhen (CN); Lewis Marton, Lurline Bay (AU); Luis A. Anjos, Liverpool (AU); Peter M. Buckingham, Yagoona (AU)

(73) Assignee: Liebert Corporation, Columbus, OH (US)

( * ) Notice: Subject to any disclaimer, the term of this patent is extended or adjusted under 35 U.S.C. 154(b) by 951 days.

(21) Appl. No.: 12/166,434

(22) Filed: Jul. 2, 2008

(65) Prior Publication Data

US 2009/0129913 A1 May 21, 2009

Related U.S. Application Data

(60) Provisional application No. 60/989,741, filed on Nov. 21, 2007.

(51) Int. Cl.
*F01D 25/24* (2006.01)
*F03B 11/02* (2006.01)
*F04D 29/40* (2006.01)
(52) U.S. Cl. .............................. 415/126; 415/1; 417/316
(58) Field of Classification Search ........... 415/1, 213.1, 415/126, 214.1, 220; 417/361, 363, 423.14, 417/423.15
See application file for complete search history.

(56) References Cited

U.S. PATENT DOCUMENTS

| 2,984,089 | A * | 5/1961 | Whitesel .......................... 62/429 |
| 6,594,148 | B1 | 7/2003 | Nguyen et al. |
| 6,594,150 | B2 | 7/2003 | Creason et al. |
| 6,604,916 | B2 | 8/2003 | Lu et al. |
| 6,714,411 | B2 | 3/2004 | Thompson et al. |
| 6,904,482 | B2 | 6/2005 | Rietze et al. |
| 6,932,696 | B2 | 8/2005 | Schwartz et al. |

(Continued)

FOREIGN PATENT DOCUMENTS

CA 02457106 8/2005

(Continued)

OTHER PUBLICATIONS

Data Center Cooling Strategies Technology Brief; © 2007 Hewlett-Packard; 17 Pages; Aug. 2007 http://h20000.wwww2.hp.com/bc/docs/support/SupportManual/c01153741/c01153741.pdf.

(Continued)

*Primary Examiner* — S. V Clark
(74) *Attorney, Agent, or Firm* — Harness, Dickey & Pierce, P.L.C.

(57) ABSTRACT

A conditioning unit can allow the blower to be easily translated from a first operable position in the conditioning unit to a second operable position external to the conditioning unit. The translation of the blower does not require the disconnection of the blower and, accordingly, does not require that the blower be disconnected and reconnected to the control system. Such capability can facilitate the installation of the conditioning unit into a variety of applications and allows the purchaser to customize the blower location based on the desired performance. The ability to customize the installation of the conditioning unit without requiring disconnection and reconnection of the blower can reduce the cost and expense associated with the installation into differing applications.

33 Claims, 21 Drawing Sheets

U.S. PATENT DOCUMENTS

| | | | |
|---|---|---|---|
| 6,985,358 B2 | 1/2006 | Thompson et al. | |
| 7,296,106 B2 | 11/2007 | Doblar et al. | |
| 7,312,990 B2 | 12/2007 | Mangold | |
| 7,316,606 B2 * | 1/2008 | Shipley et al. | 454/184 |
| 2003/0223193 A1 | 12/2003 | Smith et al. | |
| 2005/0225936 A1 | 10/2005 | Day | |
| 2007/0213000 A1 | 9/2007 | Day | |
| 2008/0041077 A1 | 2/2008 | Tutunoglu | |
| 2008/0160902 A1 * | 7/2008 | Desler | 454/251 |
| 2009/0208327 A1 * | 8/2009 | Ito et al. | 415/143 |
| 2010/0110633 A1 * | 5/2010 | Gigushinsky | 361/695 |
| 2011/0207391 A1 * | 8/2011 | Hamburgen et al. | 454/184 |

FOREIGN PATENT DOCUMENTS

| | | |
|---|---|---|
| JP | 63-226548 | 9/1988 |
| JP | 03-244950 | 10/1991 |

OTHER PUBLICATIONS

Precision Air Conditioners for Mission Critical Environments; Stulz GmbH; CyberAir™ Vertical Floor Mounted Precision Air Conditioners, © Sep. 2003; http://alpha.ats.stulz.com/download/precisionac/ds_cyberair.pdf.

Precision Air Conditioners for Mission Critical Environments; Stulz GmbH; CyberTWO™ Floor Mounted Precision Air Conditioners, © Nov. 2007; http://alpha.ats.stulz.com/download/precisionac/ds_cybertwo.pdf.

Precision Air Conditioners for Mission Critical Environments; Stulz GmbH; Compact CWE™ Floor Mounted Precision Air Conditioners, © Aug. 2007; http://alpha.ats.stulz.com/download/precisionac/ds_compactcw.pdf.

Precision Air Conditioners for Mission Critical Environments; Stulz GmbH; Flair™ Floor Console Mounted Precision Air Conditioners, © Dec. 2003; http://alpha.ats.stulz.com/download/precisionac/ds_flair.pdf.

Precision Air Conditioners for Mission Critical Environments; Stulz GmbH; ModulAiR™ Floor Mounted Precision Air Conditioners, © Nov. 2007; http://alpha.ats.stulz.com/download/precisionac/ds_modulair.pdf.

Precision Air Conditioners for Mission Critical Environments; Stulz GmbH; Mini-Space™ Floor Mounted Precision Air Conditioners, © Aug. 2006; http://alpha.ats.stulz.com/download/precisionac/ds_minispace.pdf.

International Search Report for PCT/US2008/008301, dated Oct. 28, 2008.

* cited by examiner

COMPUTER ROOM ENVIRONMENTAL CONDITIONING UNIT WITH TRANSLATABLE BLOWERS

CROSS-REFERENCE TO RELATED APPLICATIONS

This application claims the benefit of U.S. Provisional Application No. 60/989,741, filed on Nov. 21, 2007. The disclosure of the above application is incorporated herein by reference.

FIELD

The present invention relates to computer room environmental conditioning units and, more particularly, to conditioning units wherein the blower is translatable between different positions.

BACKGROUND AND SUMMARY

The statements in this section merely provide background and summary information related to the present teachings and may not constitute prior art.

Computer rooms utilize environmental conditioning unit(s) to condition the environment within which the computer equipment is located. The conditioning unit includes a heat exchanger through which air within a computer room is drawn to condition the air. A blower is utilized to draw air through the conditioning unit and across the heat exchanger. The conditioning unit is typically included in a cabinet than can be positioned in the computer room. The blower can be located in the cabinet or, alternatively, can be located external to the cabinet. For example, the blower can be located in a lower part of the conditioning unit and direct air flow through the cabinet and discharge into the space beneath the raised floor. Alternatively, the blower can be disposed below the raised floor and draw air through the cabinet and discharge into the raised floor. These types of arrangements are called down-flow arrangements (i.e., the blower discharges air into the space below the raised floor). In another type of arrangement, the blower can be located in the top portion of the conditioning unit and draws air from the computer room into the lower part of the conditioning unit which then flows through the conditioning unit and discharges through the top of the conditioning unit. These types of arrangements are called up-flow arrangements (i.e., the blower discharges air out the top of the conditioning unit).

In most applications, it is desirable to retain the blower unit within the conditioning unit. In other applications, it may be desirable to position the blower external to the unit, such as below the raised floor or above the conditioning unit. The conditioning unit, however, typically ships with the blower installed in the conditioning unit. To move the blower to another position may require the blower to be disconnected, relocated, and then electrically re-connected to the control system. The electrical connections and the control connections of the blower unit may be required to be certified to particular codes or standards. Therefore, the relocating of the blower may require that the blower and the conditioning unit be recertified before being put into use. Such tasks can be labor intensive and can increase the cost of changing the location of the blower.

A conditioning unit according to the present teachings can advantageously allow the blower to be easily translated from a first operable position in the conditioning unit to a second operable position external to the conditioning unit. The translation of the blower does not require the disconnection of the blower and, accordingly, does not require that the blower be disconnected and reconnected to the control system. Such capability can facilitate the installation of the conditioning unit into a variety of applications and allows the purchaser to customize the blower location based on the desired performance. The ability to customize the installation of the conditioning unit without requiring complex or arduous tasks or disconnection and reconnection of the blower can reduce the cost and expense associated with the installation of the conditioning unit into differing applications. Moreover, the ability to easily move the blower between multiple positions without requiring disconnection and reconnection can reduce the types of conditioning units that a manufacturer is required to offer to supply conditioning units for various applications.

A computer room environmental conditioning unit according to the present teachings can include a structural assembly and at least one blower operable to draw a flow of air through the conditioning unit. The at least one blower is coupled to the structural assembly and can be moved between first and second positions relative to the structural assembly. The at least one blower is coupled to the structural assembly in both the first and second positions.

A method according to the present teachings can include coupling at least one blower to a structural assembly of a computer room environmental conditioning unit, the at least one blower being coupled to the structural assembly in a first position and operable to be moved to a second position different than the first position and being coupled to the structural assembly in both of the first and second positions. The method can include connecting the at least one blower to a control system of the conditioning unit and shipping the conditioning unit to an installation site with the at least one blower in the first position and connected to the control system. The at least one blower is positioned in one of the first and second positions at the installation site. The conditioning unit is installed in a computer room at the installation site and the at least one blower is operated.

Further areas of applicability will become apparent from the description provided herein. It should be understood that the description and specific examples are intended for purposes of illustration only and are not intended to limit the scope of the present teachings.

DRAWINGS

The drawings described herein are for illustration purposes only and are not intended to limit the scope of the present teachings in any way.

DETAILED DESCRIPTION

Figure 1:
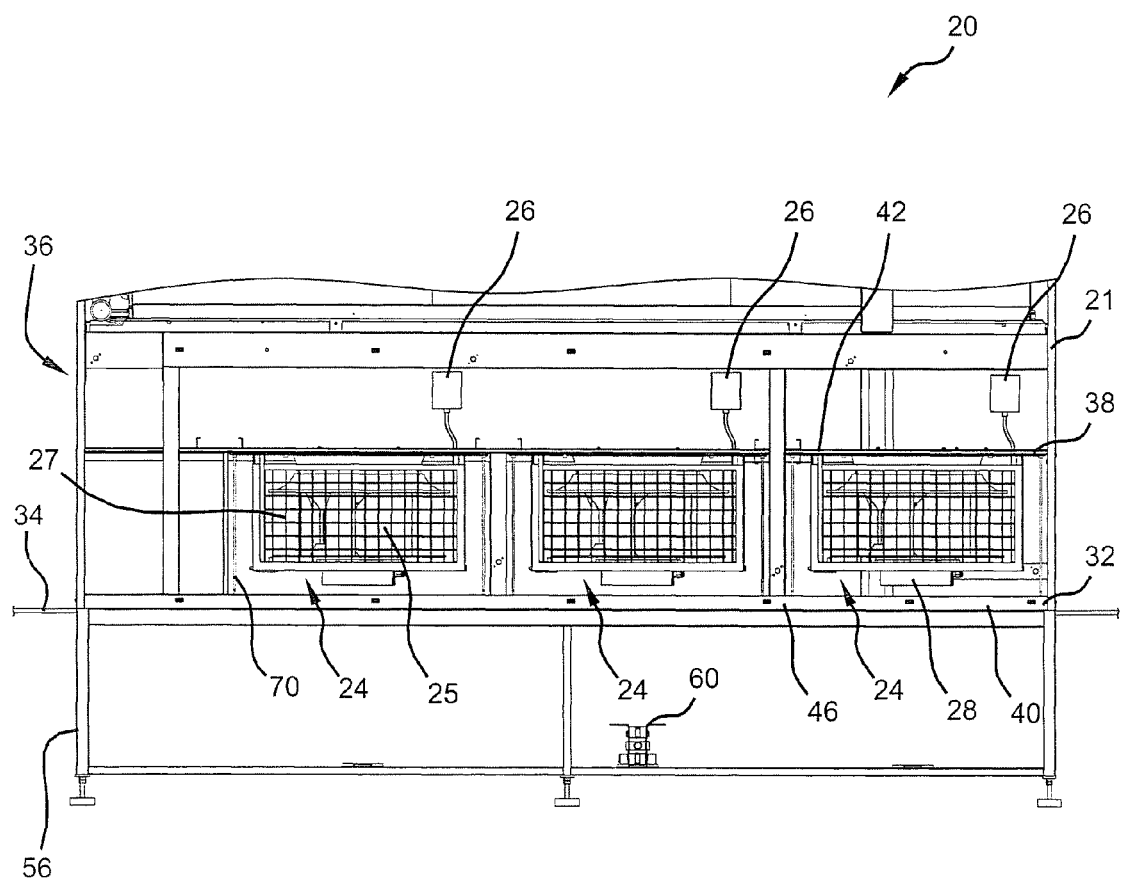
FIG. 1 is a fragmented plan view of a first embodiment of a computer room environmental conditioning unit with translatable blowers according to the present teachings with all three blowers in a first operating position in the lower part of the conditioning unit.

The following description is merely exemplary in nature and is not intended to limit the present teachings, applications, or uses. It should be understood that throughout the drawings, corresponding reference numerals indicate like or corresponding parts and features (e.g., 20, 120, 220, etc.).

Referring to FIGS. 1-6, a first embodiment of a computer room environmental conditioning unit 20 with translatable blowers according to the present teachings is shown. Conditioning unit 20 is illustrated in a simplified form without all of the details shown. Conditioning unit 20 includes a plurality of panels 21 that surround and enclose conditioning unit 20 and form a cabinet. Conditioning unit 20 includes a variety of components that are operable to condition an air flow flowing therethrough. Conditioning unit 20 includes a heat exchanger 22 which is operable to transfer heat between a fluid flowing through heat exchanger 22 and an air flow flowing across heat exchanger 22. Heat exchanger 22 can take a variety of forms. As a non-limiting example, one type of heat exchanger includes a fin on tube heat exchanger wherein the heat transfer fluid flows through the tubes and the air flow flows across the fins. Conditioning unit 20 includes a plurality of blowers 24 that are operable to direct the air flow across heat exchanger 22. Conditioning unit 20 includes a control system 26 which it is connected to blowers 24. Control system 26 can be operable to supply electrical power to motors 28 of blowers 24 and can command blowers 24 to turn on and off and can vary the blower speed. Control system 26 can also control other components of conditioning unit 20, such as valves or other mechanisms controlling the flow of the heat transfer fluid through heat exchanger 22. Blowers 24, by way of non-limiting example, can include a fan member 25 driven by motor 28 and surrounded by a screen or cage 27.

Conditioning unit 20 shown in FIGS. 1-6 is a down-flow type conditioning unit. Blowers 24 draw air from above conditioning unit 20 into the conditioning unit, through filters (not shown), across heat exchanger 22, and discharge the air out of the bottom 32 of conditioning unit 20 and into the space below the raised floor 34 of the computer room.

Figure 2:
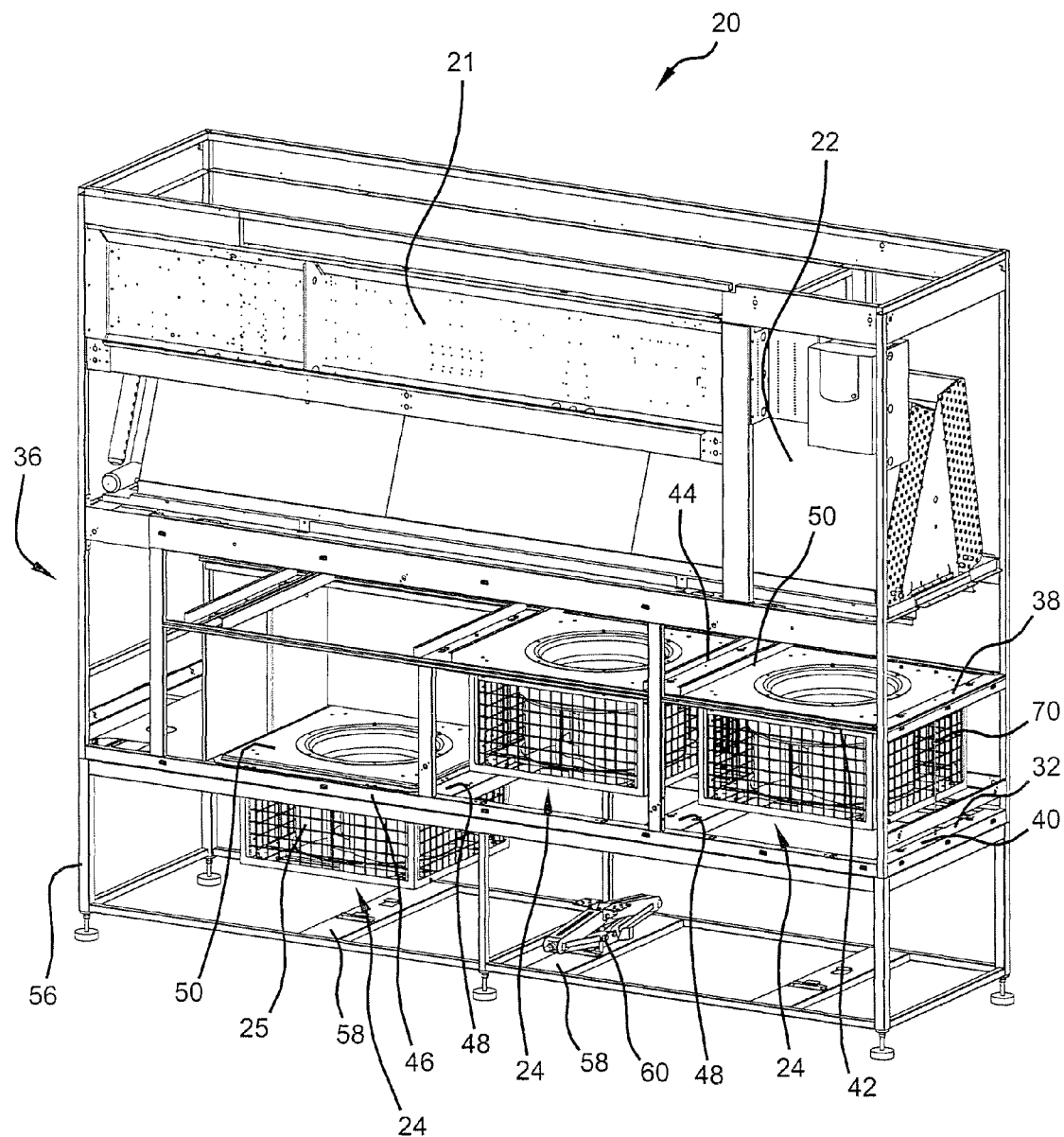
FIG. 2 is a fragmented perspective view of the conditioning unit of FIG. 1 with one of the blowers lowered into a second operating position below the conditioning unit.
Figure 3:
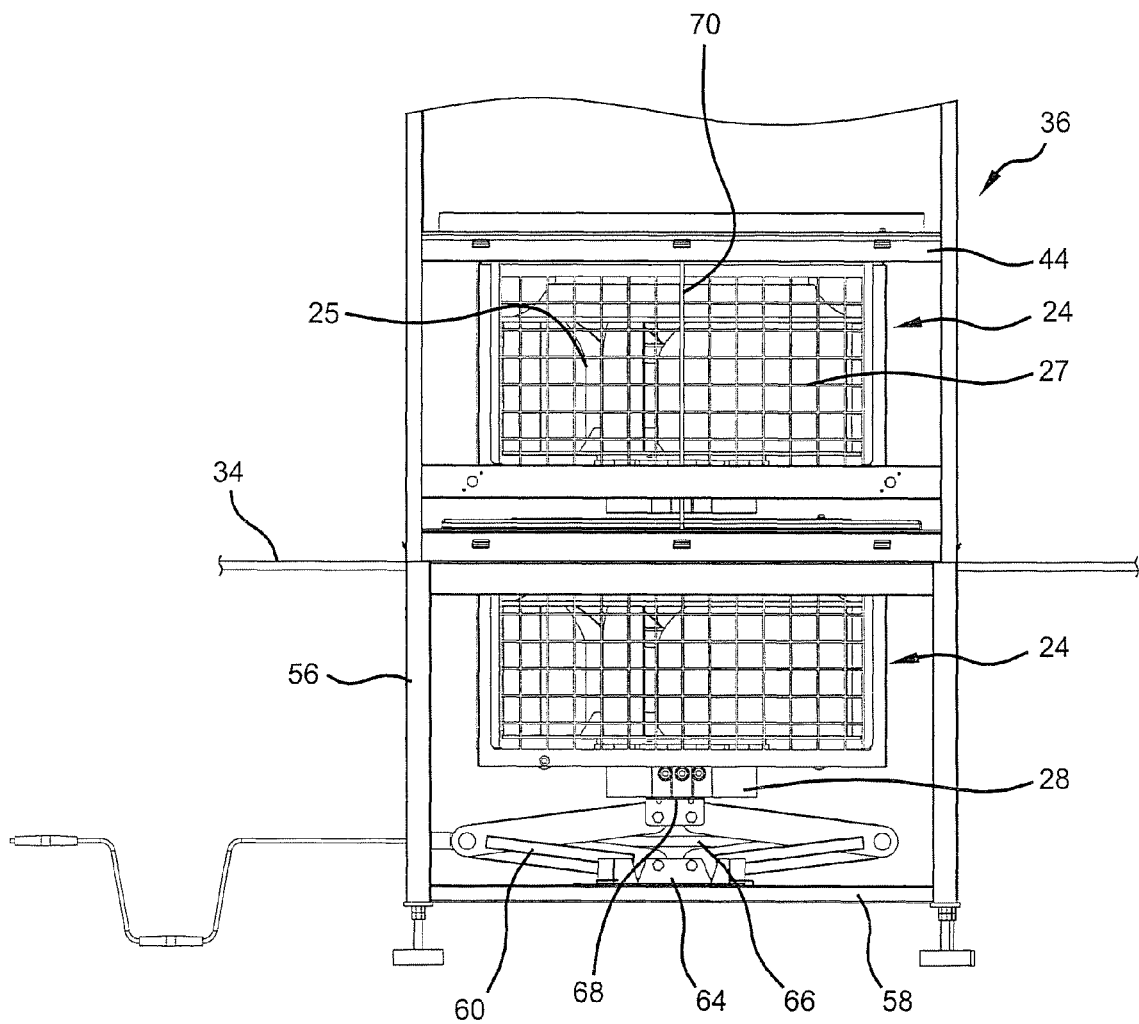
FIG. 3 is a fragmented side plan view of the conditioning unit of FIG. 2 showing the lowering of one of the blowers into the second operating position.
Figure 4:
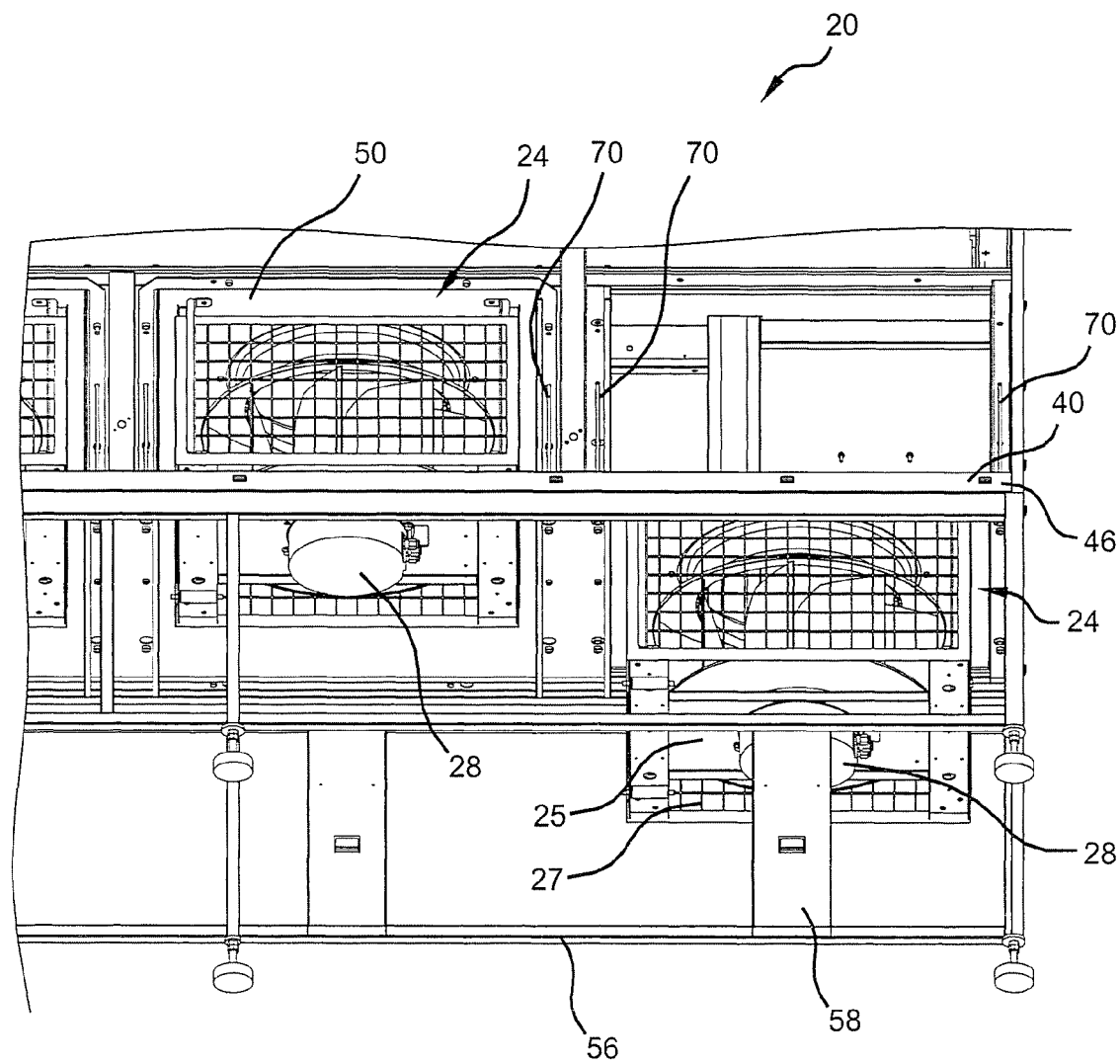
FIG. 4 is another fragmented perspective view of a portion of the conditioning unit of FIG. 2 showing one of the blowers in the second operating position.
Figure 5:
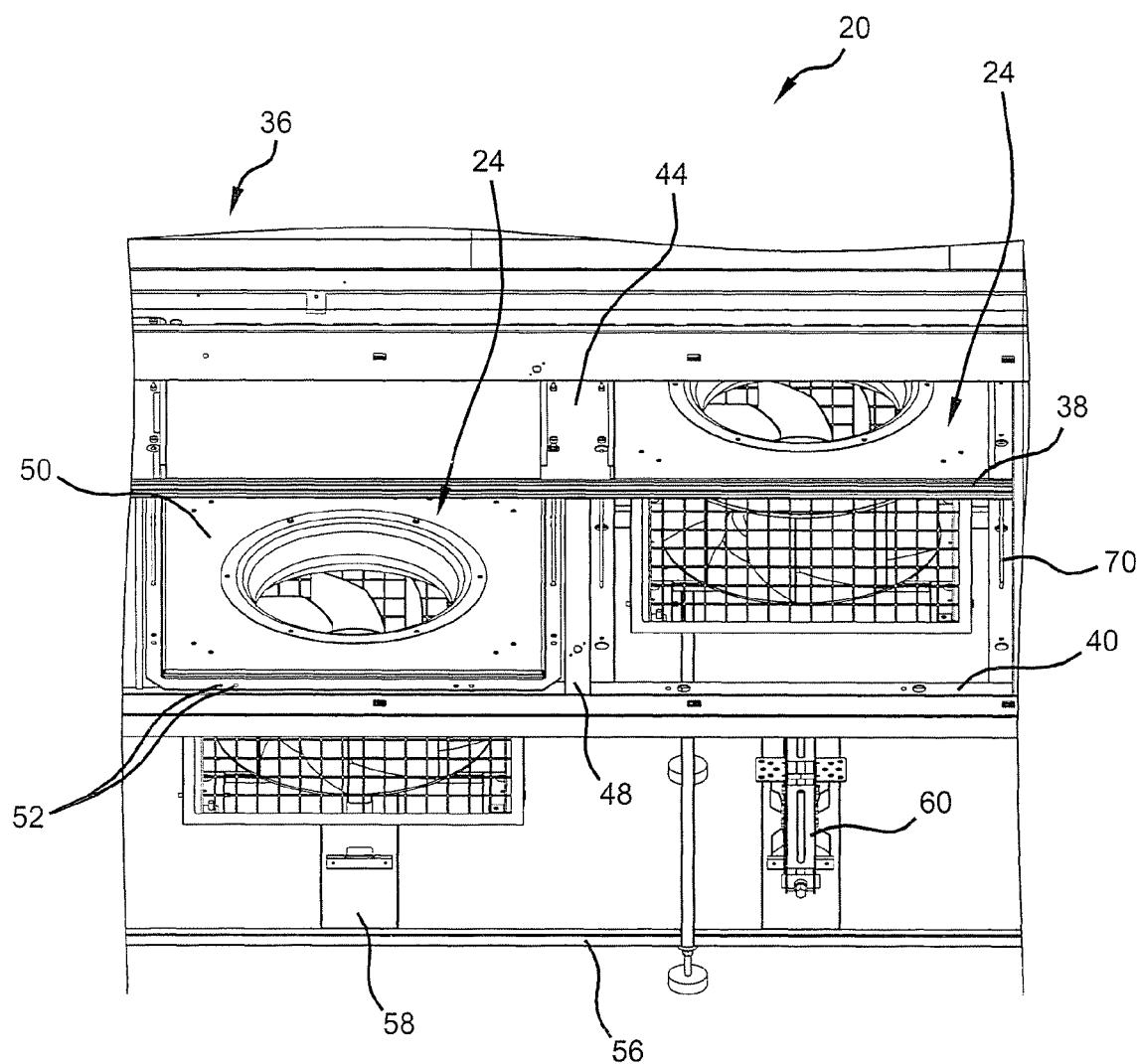
FIG. 5 is another fragmented perspective view of the conditioning unit of FIG. 2 showing one of the blowers in the second operating position.

Conditioning unit 20 allows blowers 24 to be moved between a first operable position, such as that shown in FIG. 1, to a second operable position, such as shown in FIG. 2, wherein the leftmost blower has been lowered to the second operable position. When in the second position, blower 24 is primarily located in the space below raised floor 34. In both positions, blowers 24 draw air into conditioning unit 20 from above and discharge the air into the space beneath raised floor 34. When shipped from the factory, blowers 24 are all in the raised first position, as shown in FIG. 1.

To allow for the movement of blowers 24 between the first and second operative positions, conditioning unit 20 includes a structural assembly 36 that enables blowers 24 to be secured and operated in both the first and second positions. Structural assembly 36 includes an upper level 38 and a lower level 40. Upper level 38 includes a pair of longitudinally extending support members 42 and a plurality of laterally extending support members 44 that extend laterally between support members 42. Similarly, lower level 40 also includes a pair of longitudinally extending support members 46 and a plurality of laterally extending support members 48 that extend laterally between support members 46. Lower level 40 also defines bottom 32 of conditioning unit 20. Support members 42, 44 and 46, 48 form a plurality of rectangular openings within which blowers 24 are disposed.

Blowers 24 include an upper outwardly extending flange 50 that is coupled to the upper and lower levels 38, 40 when in the respective first and second operative positions. Specifically, when blowers 24 are secured in the first position, flange 50 is secured to the bottom surface of support members 42, 44 of upper level 38. Blowers 24 can be secured thereto with the use of threaded fasteners which can be inserted into openings 52 in flange 50 from below or above and secured to support members 42, 44. Support members 42, 44 can have threaded openings that are complementary to the fasteners, thereby enabling blowers 24 to be secured to upper level 38 with fasteners inserted from beneath or above flange 50. In the second operative position, flange 50 rests on the top surface of support members 46, 48 of lower level 40. Support members 46, 48 can have a plurality of threaded openings that align with openings 52, thereby enabling blowers 24 to be secured to the lower level 40 with threaded fasteners. When secured to lower level 40, fasteners are inserted through the top side of flange 50.

Figure 6:
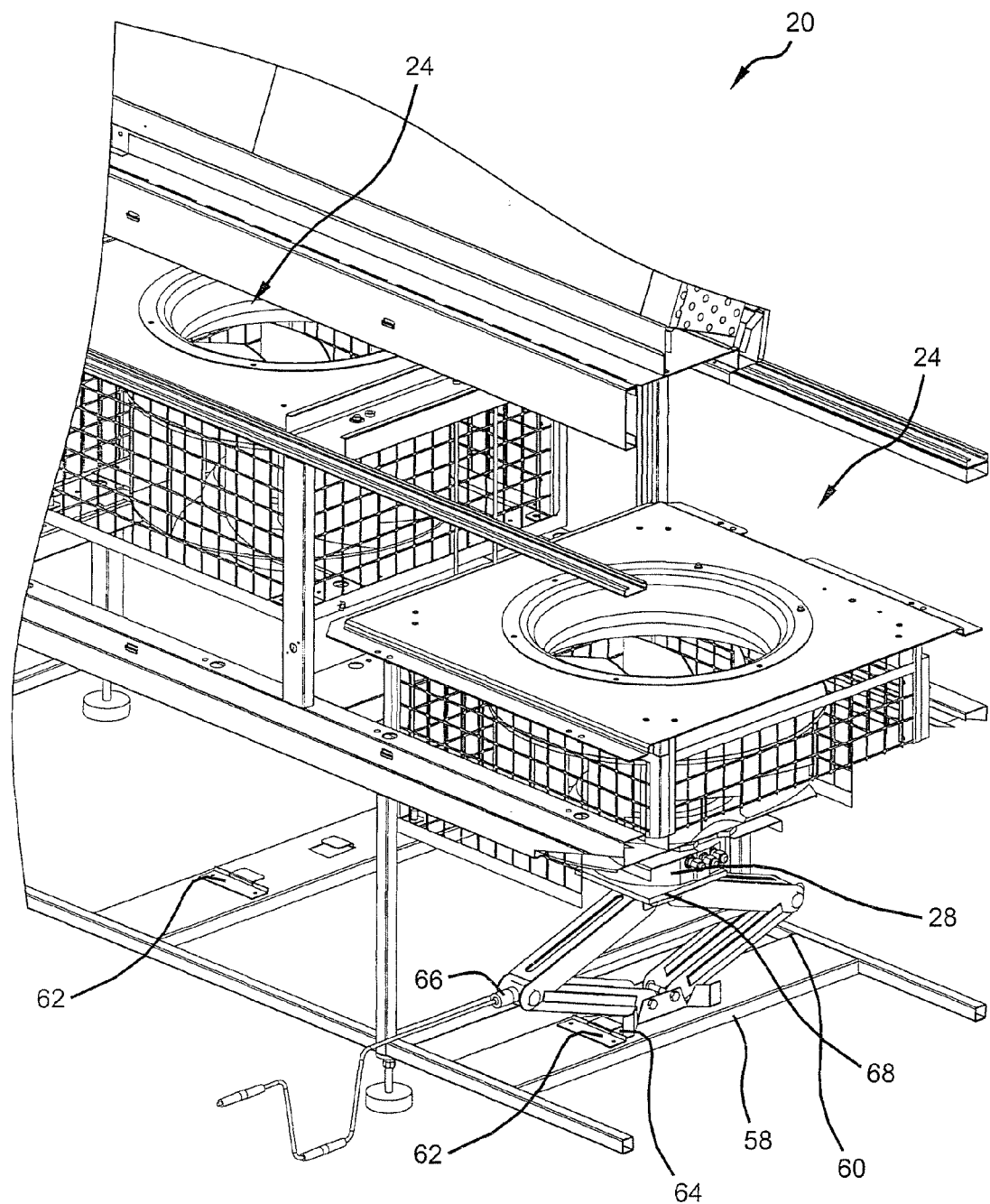
FIG. 6 is a perspective view of a scissor jack used to move the blower between the first and second operating positions.

Various mechanisms can be used to move blowers 24 from the first operable shipped position, as shown in FIG. 1, to the second operable position, as shown in FIG. 2. Conditioning unit 20 is disposed on a support frame 56 which supports conditioning unit 20 such that bottom 32 is substantially flush with raised floor 34. Support frame 56 includes a plurality of laterally extending rails 58. One rail 58 is associated with each blower 24. Rails 58 are configured to retain a jack mechanism 60, such as a scissor jack, thereto. Scissor jack 60 is used to move blowers 24 between the first and second positions. As best seen in FIG. 6, rail 58 includes an extension 62 which can receive a portion of the base 64 of scissor jack 60. Extension 62 aligns scissor jack 60 beneath an associated blower 24 while also inhibiting movement of scissor jack 60 relative to rail 58 during the movement of an associated blower 24 between the first and second positions.

As stated above, conditioning unit 20 is shipped from the factory with blowers 24 in the first operative position, as shown in FIG. 1. To move blowers 24 from the first position to the second position, scissor jack 60 is disposed beneath the blower 24 that is to be moved with base 64 engaging with extension 62. Threaded rod 66 of scissor jack 60 is rotated to cause top plate 68 of scissor jack 60 to move upwardly and support motor 28 of the associated blower 24. With scissor jack 60 in place supporting blower 24, the fasteners securing blower 24 to upper level 38 can be removed. Threaded rod 66 is now rotated in the opposite direction to lower top plate 68 and blower 24 from the first position to the second position. A pair of guide members 70, in this case in the form of guide rods, extends between upper and lower levels 38, 40 through flange 50 of blower 24. Guide rods 70 guide the motion of blower 24 between the first and second positions. Guide rods 70 help maintain the alignment of blowers 24 with upper and lower levels 38, 40. It should be appreciated that the guide members can take forms other than the guide rods 70 shown and that guide rods 70 are merely a non-limiting example of suitable guide members 70. Threaded rod 66 is rotated until flange 50 of blower 24 rests on lower level 40. The fasteners can then be used to secure flange 50 to support members 46, 48 of lower level 40, thereby securing blower 24 in the second position. The opposite steps can be performed to move blower 24 from the second position to the first position.

During the movement of blower 24 between the first and second positions, blower 24 remains connected to control system 26. Thus, when blowers 24 are secured in a lowered second position, blowers 24 are ready to be operated along with conditioning unit 20.

To remove scissor jack 60, threaded rod 66 can continue to be rotated to lower top plate 68 away from motor 28 of the associated blower 24. Once scissor jack 60 has been reduced to the appropriate height, scissor jack 60 can be disengaged from extension 62 and moved to a different rail 58 to move the blower 24 thereabove between the first and second positions. Scissor jack 60 can remain on one of the rails 58 during operation such that in a future maintenance need the scissor jack 60 is in place and readily available for use.

Conditioning unit 20 is assembled at the factory with blowers 24 secured to upper level 38. At the factory, blowers 24 are connected to control system 26 and the operation of blowers 24 is tested. The testing can include determining whether blowers 24 are functioning, checking the level of vibration due to blower operation, checking for proper electrical connection, checking for proper electrical grounding, and checking for proper voltage for the motor 28 by way of non-limiting example. The testing also includes certifying conditioning unit 20 as meeting the applicable rating standards. For example, one type of rating standard is a CSA/UL 236/1995 rating. Thus, blowers 24 of conditioning unit 20, when shipped, are in a certified operating condition and can be placed in the computer room, electrical power connected to conditioning unit 20, and operation can commence.

Thus, a user or purchaser of conditioning unit 20 can position conditioning unit 20 on an appropriate support frame, such as support frame 56, and can connect conditioning unit 20 to the appropriate external connections. Conditioning unit 20 can then be used as is with blowers 24 in their first position and secured to upper level 38. Some customers or purchasers, however, may desire that blowers 24 be positioned in the space beneath raised floor 34, which may increase the efficiency of blowers 24 and may reduce the power usage. In this instance, the purchaser or customer can utilize scissor jack 60 to move blowers 24 from the first operative position to the second operative position as discussed above. Because control system 26 remains connected to blowers 24 during the movement between the first and second operative positions, blowers 24 do not need to be electrically disconnected and then reconnected from conditioning unit 20 during their movement between the first and second operative positions.

Figure 7:
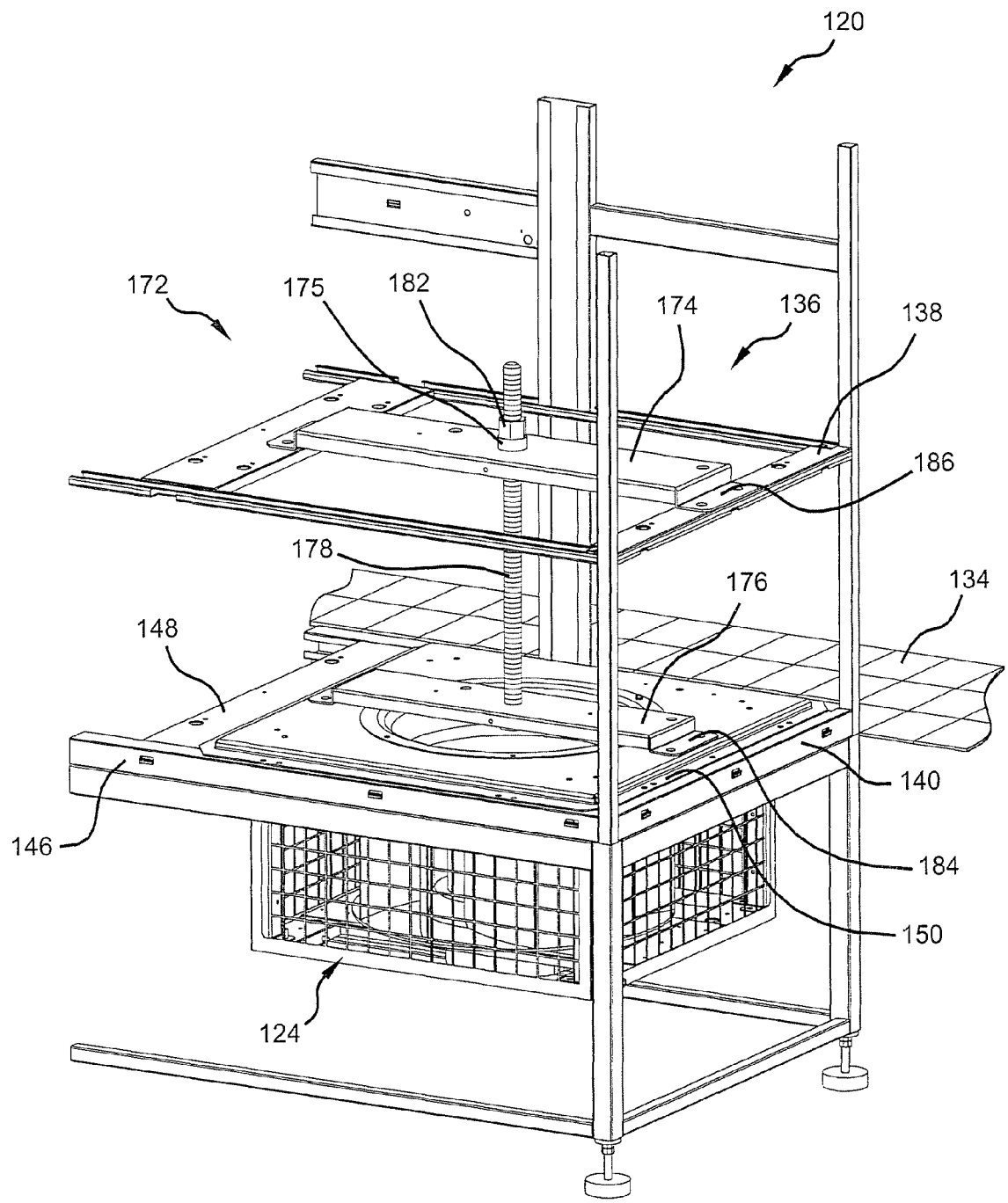
FIG. 7 is a fragmented perspective view of a portion of a second embodiment of a computer room environmental conditioning unit with translatable blowers according to the present teachings wherein a jig assembly is utilized to move the blower between the first and second operating positions and the blower is in the second operating position.
Figure 8:
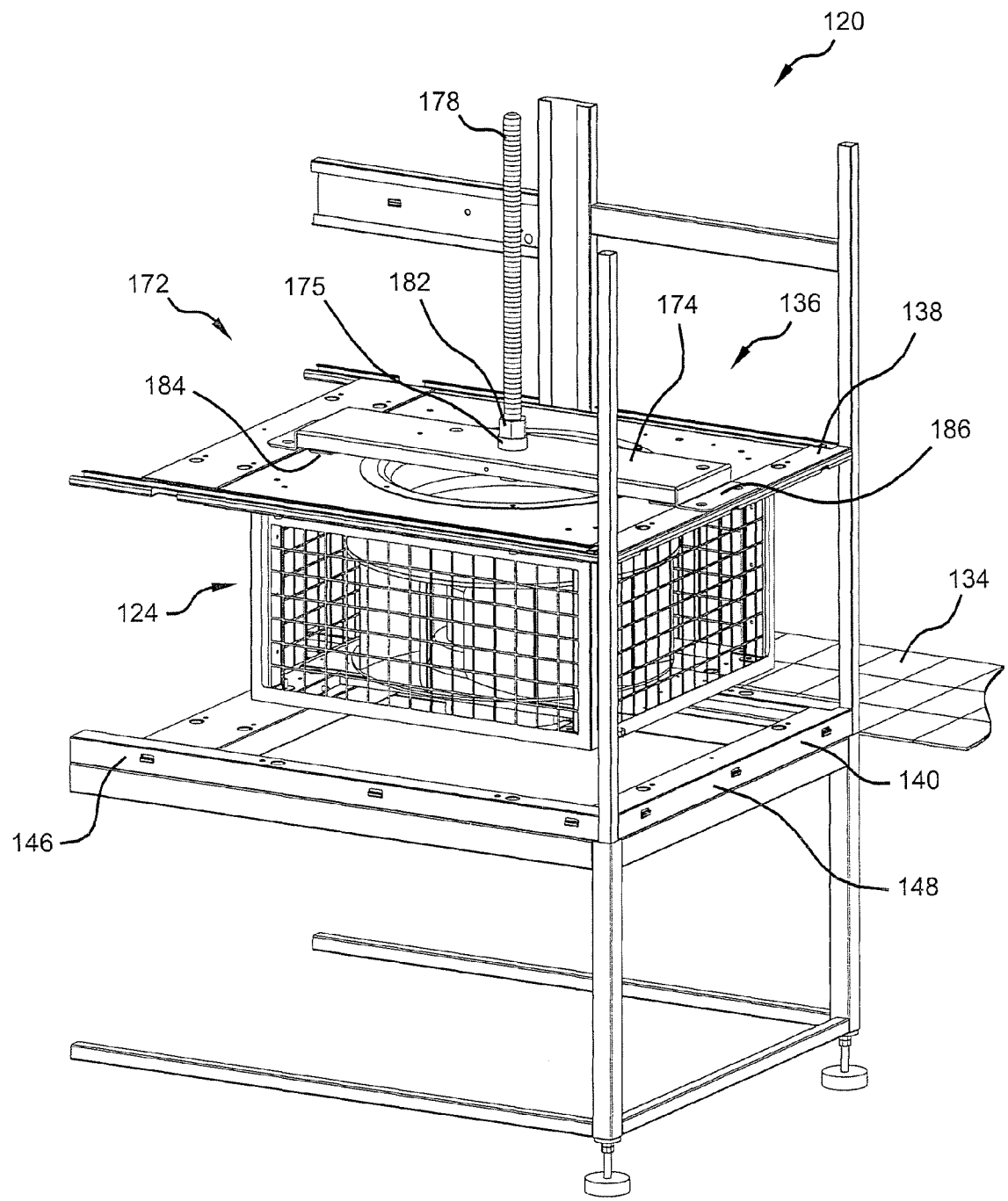
FIG. 8 is a perspective view of the conditioning unit of FIG. 7 with the blower in the first operating position and the jig assembly attached thereto.
Figure 9:
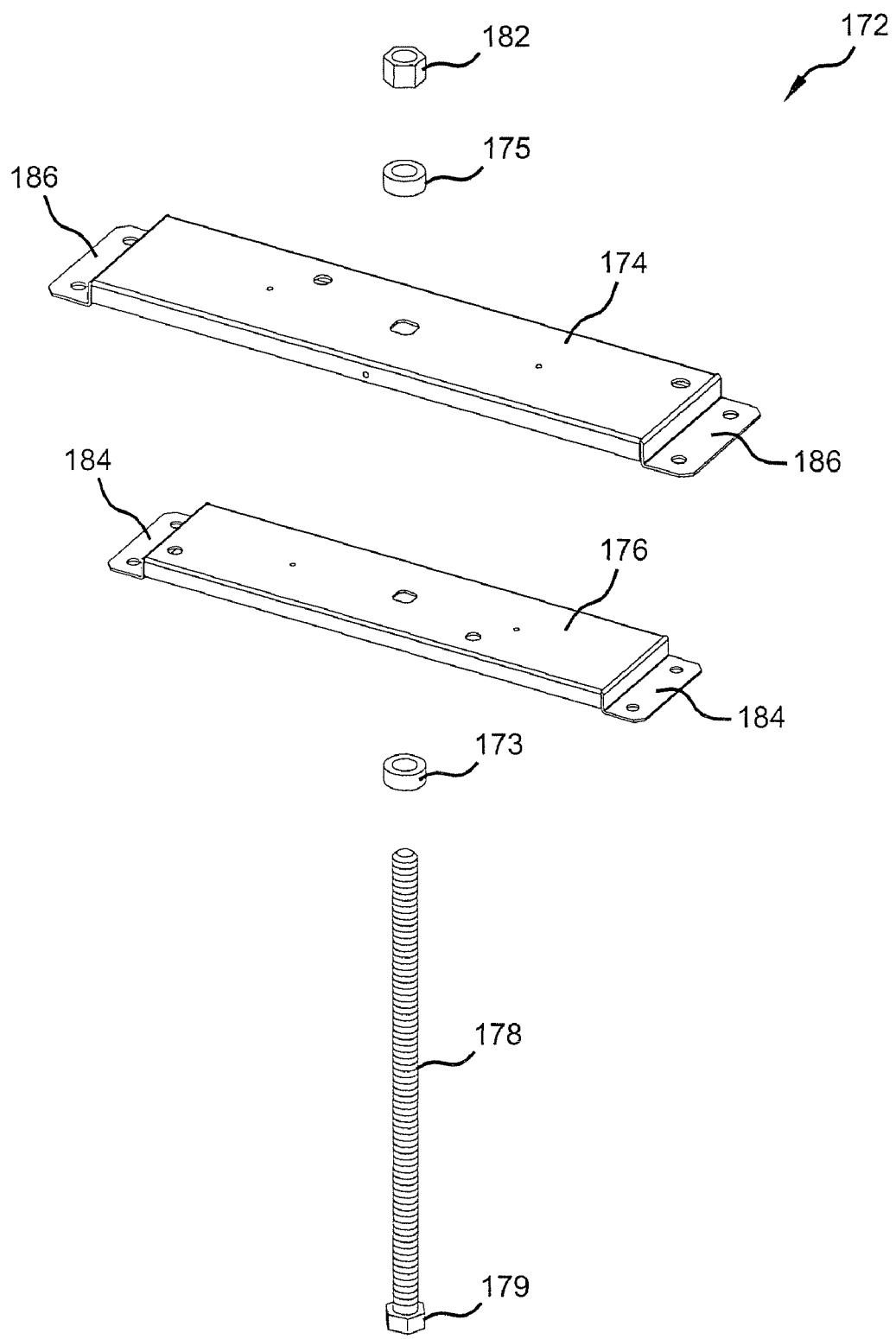
FIG. 9 is a perspective view of the jig assembly used to move the blower between the first and second positions shown in FIGS. 7 and 8.

Referring now to FIGS. 7-9, a second embodiment of a computer room environmental conditioning unit 120 having blowers 124 that can be moved between first and second operative positions according to the present teachings is shown. Conditioning unit 120 is similar to conditioning unit 20 discussed above. As such, not all of the details of conditioning unit 120 will be described.

In conditioning unit 120, blowers 124 are moved between the first and second operative positions with a jig assembly 172. Jig assembly 172 includes an upper support member 174 and a lower support member 176 that can be moved relative to one another with a threaded rod 178. Each support member 174, 176 includes a centrally located opening 180 that aligns with one another and is configured to receive threaded rod 178. Threaded rod 178 can be inserted through and engaged with central openings 180 of support members 174, 176 with the head 179 of threaded rod 178 and a washer 173 adjacent the lower surface of lower support member 176. The opposite end of threaded rod 178 extends beyond the upper surface of upper support member 174. A washer 175 and nut 182 can be secured to threaded rod 178 such that washer 175 and nut 182 are on the upper surface of support member 174. Head 179 and washer 173 and nut 182 and washer 175 thereby prevent threaded rod 178 from being removed from support members 174, 176.

Lower support member 176 includes a pair of flanges 184 on the opposite ends thereof. Flange 184 includes a plurality of openings that align with openings in flange 150 of blower 124. In this manner, lower support member 176 can be removeably secured to blower 124 with threaded fasteners. Similarly, upper support member 174 also includes a pair of flanges 186 on the opposite ends thereof. Flange 186 includes a plurality of openings that align with threaded openings in upper level 138 of structural assembly 136. Thus, jig assembly 172 can be secured to a blower 124 and upper level 138 of structural assembly 136.

To move blower 124 between the first (raised) operative position, as shown in FIG. 8, to the second (lowered) operative position, as shown in FIG. 7, jig assembly 172 is secured to the desired blower 124 to be moved and to the upper level 138 of structural assembly 136 above the blower 124 that is to be moved. When jig assembly 172 is secured to the blower 124, nut 182 can be rotated to place threaded rod 178 in tension, thereby indicating that support members 174, 176 and threaded rod 178 will support blower 124 when the fasteners securing flange 150 of blower 124 to the bottom surface of upper level 138 are removed. With jig assembly 172 in this position, the fasteners securing blower 124 to upper level 138 can be removed. Blower 124 is thereby supported by jig assembly 172. Nut 182 can be rotated relative to threaded rod 178 to move along threaded rod 178 and allow lower support member 176 to move away from upper support member 174. Nut 182 is rotated relative to threaded rod 178 until flange 150 rests on the upper surface of lower level 140 of structural assembly 136. Once in this position, the fasteners can again be utilized to secure flange 150 of blower 124 to support members 146, 148 of lower level 140. With blower 124 secured to lower level 140, jig assembly 172 can be removed from blower 124 and upper level 138. Blower 124 is now in the second operative position and is ready to be used.

Jig assembly 172 can then be used to move the other blowers 124 of conditioning unit 120 between the first and second operative positions, as desired. Jig assembly 172 is not maintained attached to conditioning unit 120 during operation. If desired, jig assembly 172 can be stored in the space beneath raised floor 134. Optionally, guide rods similar to those described above can be used to help guide movement of blowers 124 between the first and second positions.

Again, during the movement of blower 124 between the first and second operative positions, blower 124 remains connected to control system 126 and does not require disconnecting and reconnecting blower 124 from/to control system 126 to move between the first and second operative positions. To move blower 124 back to the first operative position, the opposite steps are performed with jig assembly 172.

Thus, in conditioning unit 120, a jig assembly 172 can be attached to a blower 124 and used to move the blower 124 between the first and second operative positions. Such capability allows a purchaser to utilize conditioning unit 120 with blowers 124 in the first operative position or in the second operative position, similar to that discussed above with reference to conditioning unit 20. Additionally, conditioning unit 120 can be certified at the factory and shipped to the user/purchaser as a certified conditioning unit.

Figure 10:
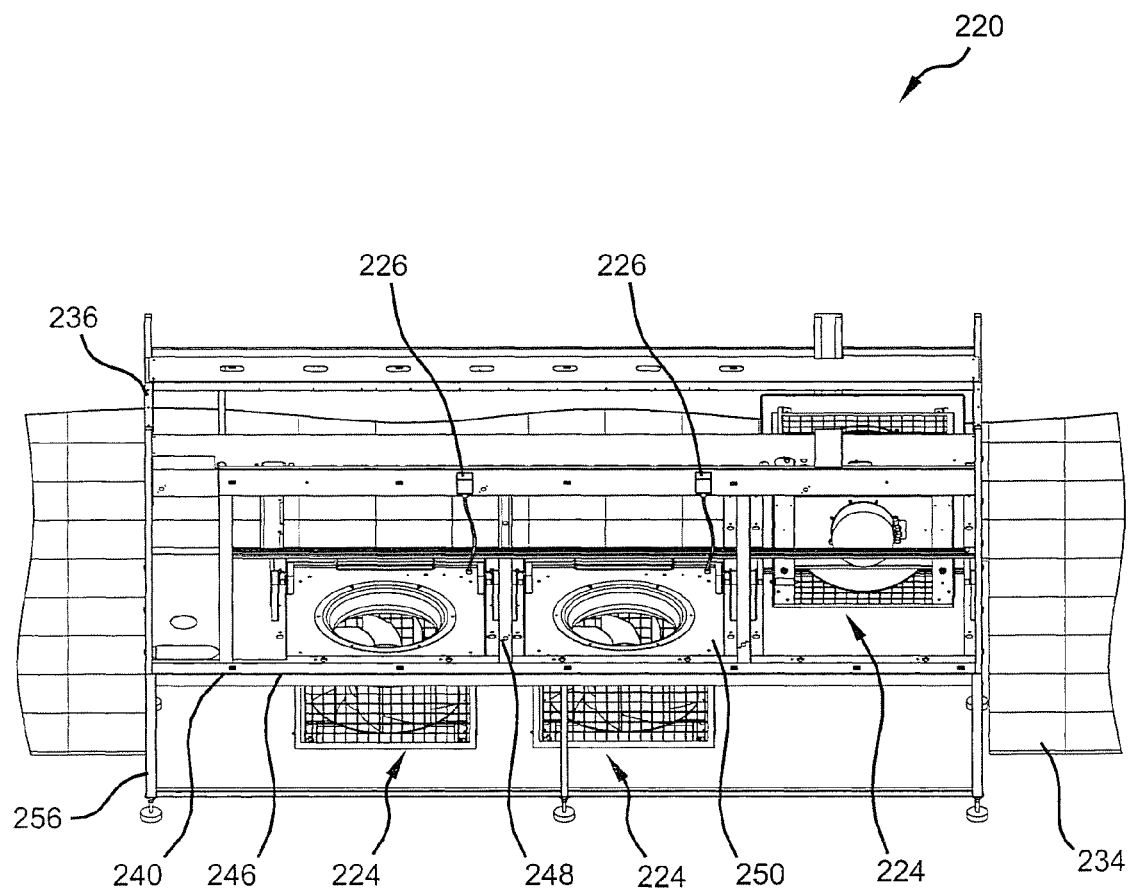
FIG. 10 is a fragmented perspective view of a third embodiment of a computer room environmental conditioning unit according to the present teachings wherein the blowers can pivot between a first shipped position and a second operating position.
Figure 11:
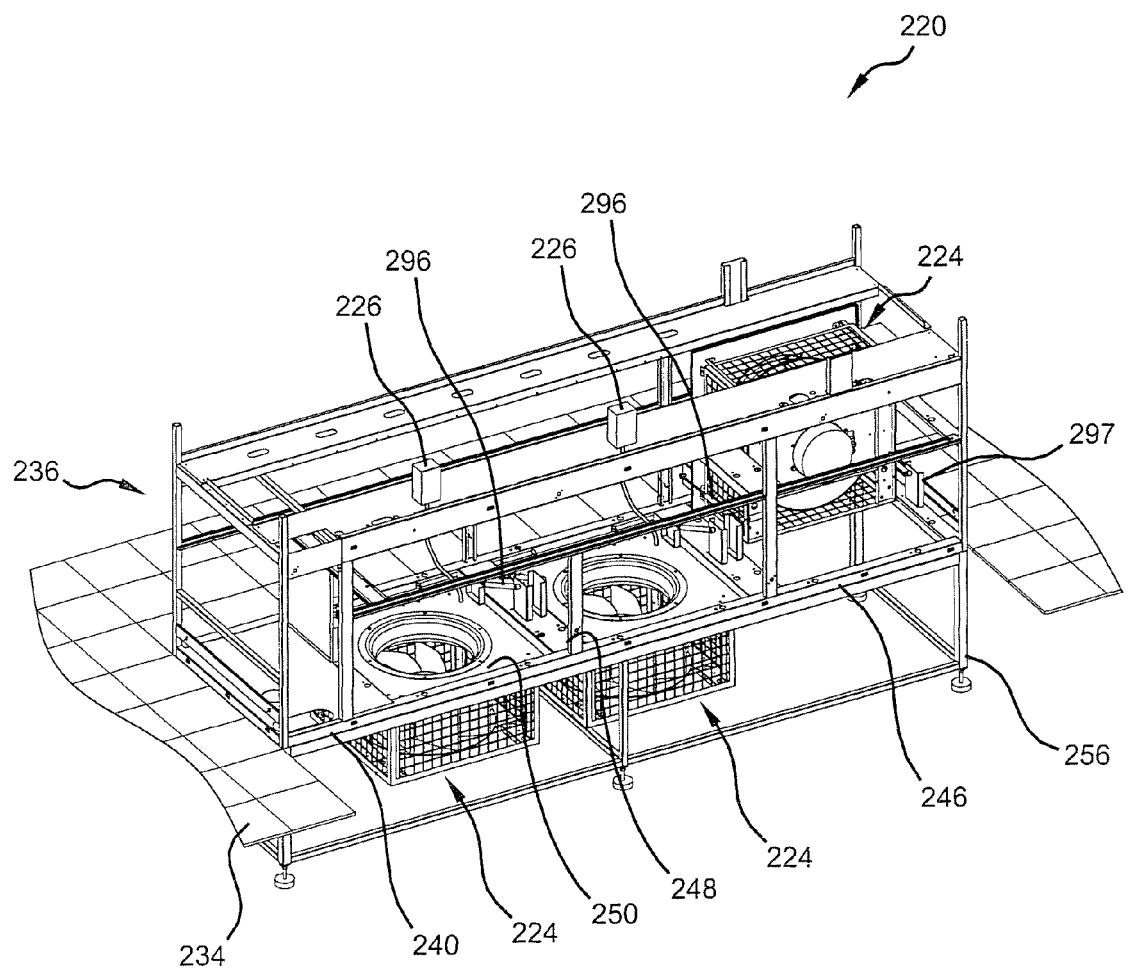
FIGS. 11 and 12 are fragmented perspective views of the conditioning unit of FIG. 10 showing the mechanism utilized to move the blowers between the first and second positions.
Figure 12:
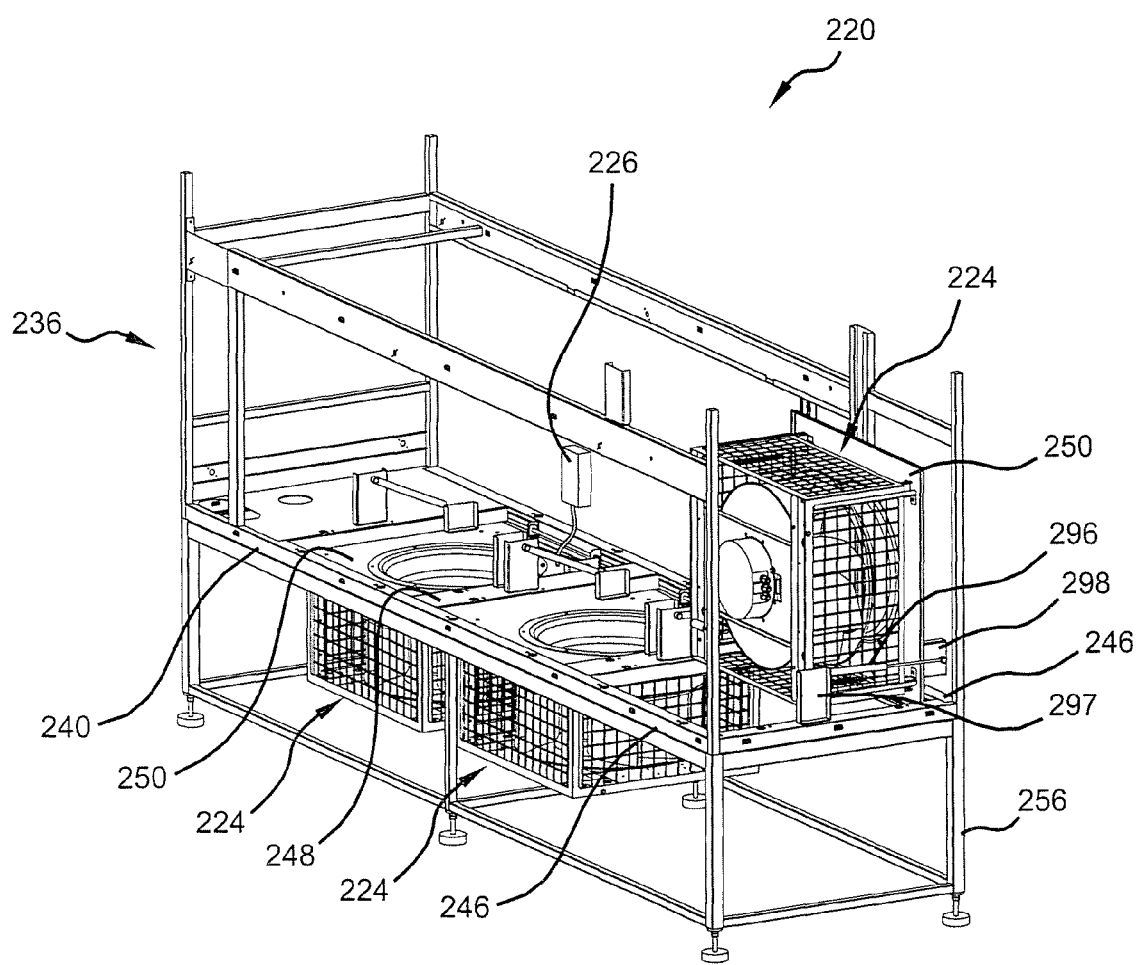
Figure 13:
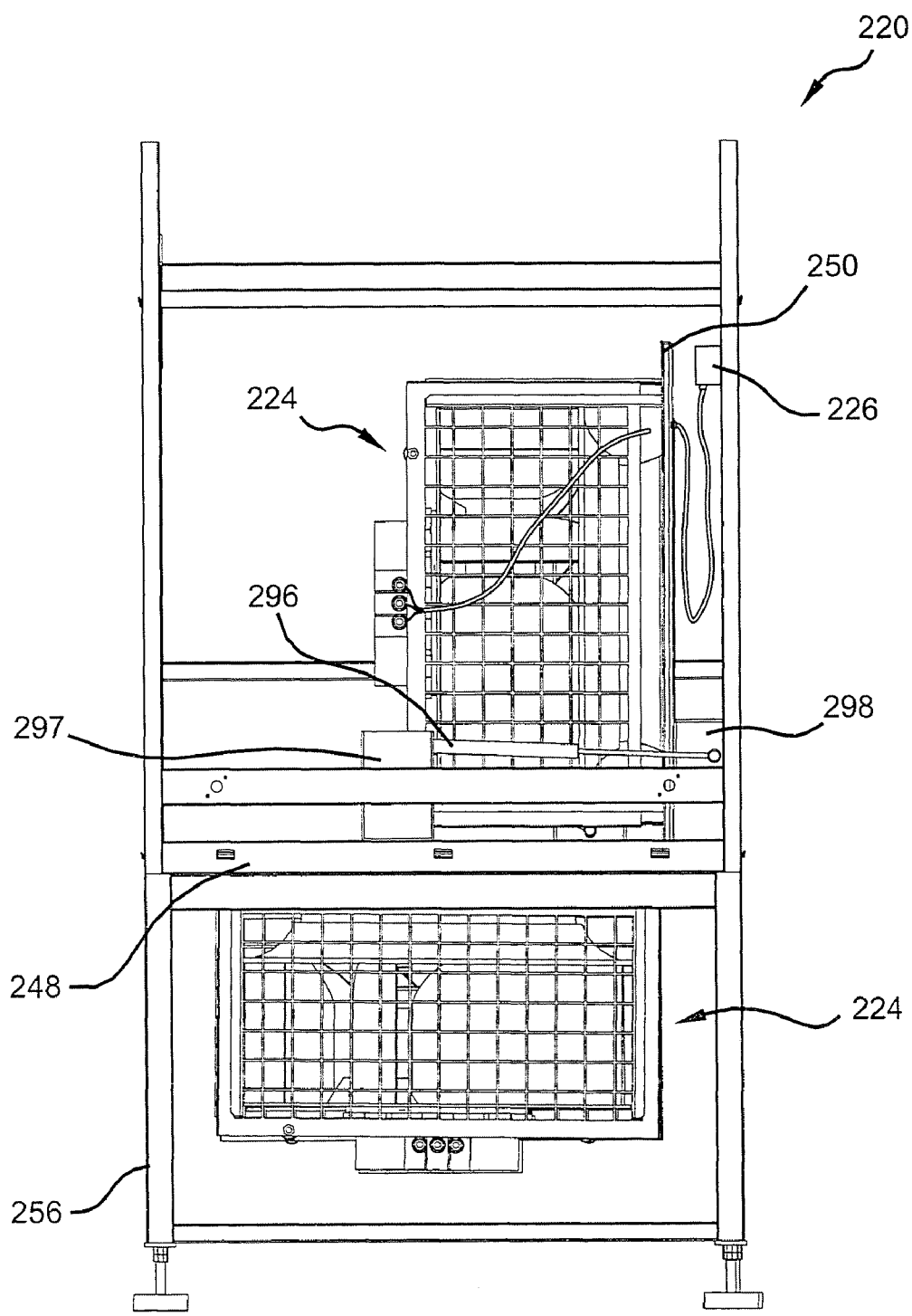
FIG. 13 is a fragmented side plan view of the conditioning unit of FIG. 10.
Figure 14:
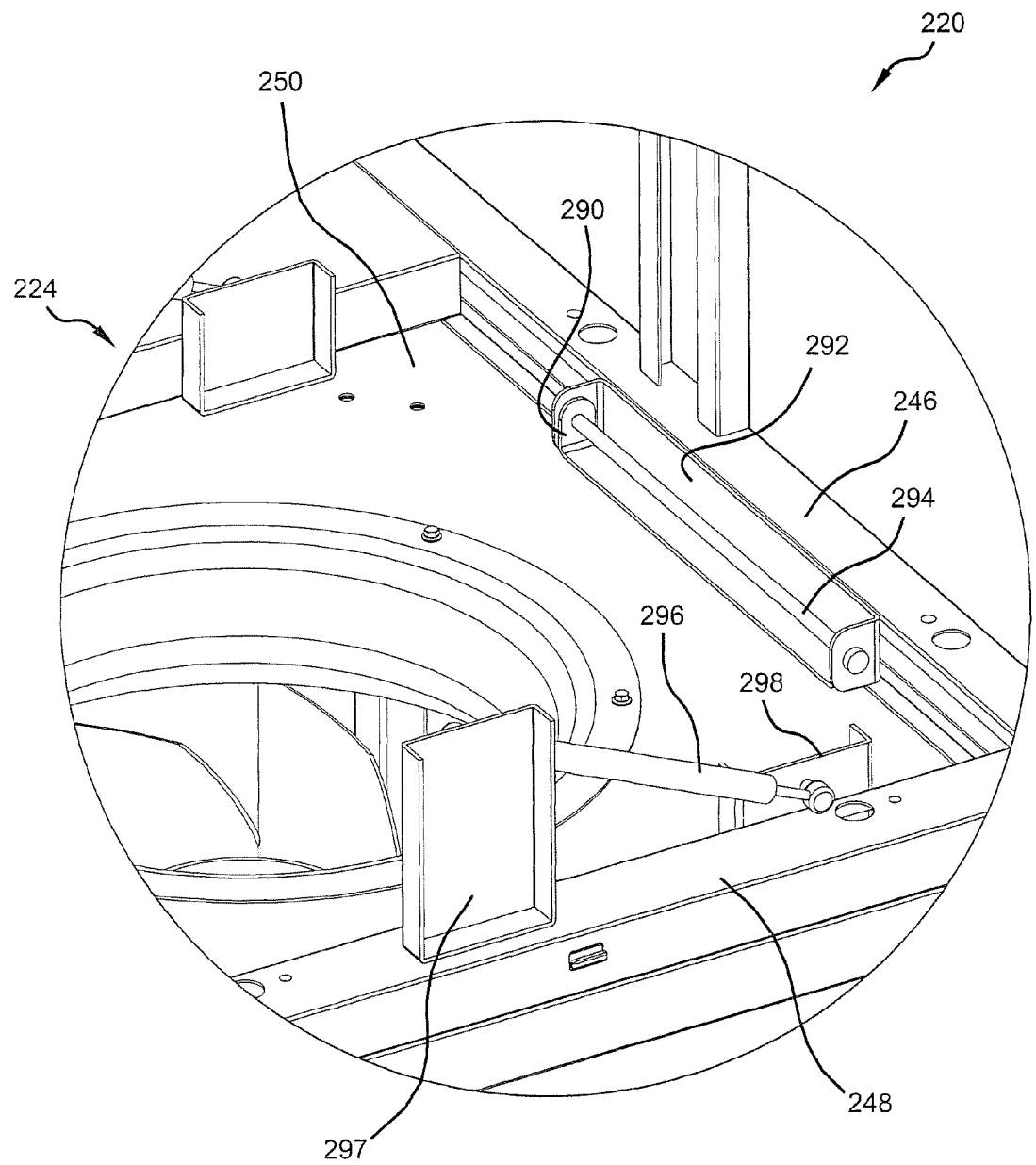
FIG. 14 is an enlarged fragmented perspective view of the hinge that couples the blowers to the conditioning unit in FIGS. 10-13.

Referring now to FIGS. 10-14, a third embodiment of a conditioning unit 220 that allows a blower 224 to be moved between first and second positions according to the present teachings is shown. Conditioning unit 220 is similar to conditioning unit 20 discussed above. Thus, all the details of conditioning unit 220 will not be described. In conditioning unit 220, however, blowers 224 are intended to be used only in the second lowered position. In conditioning unit 220, blowers 224 pivot between the first shipped position and the second lowered and operable position. In FIGS. 10-12, the rightmost blower 224 is shown in the first shipped position, while the middle and left blowers 224 are shown in the second operative position wherein blowers 224 are disposed in the space beneath raised floor 234.

Blowers 224 are pivotally secured to the rear longitudinal support member 246 of lower level 240 of structural assembly 236. One end of flange 250 of each blower 224 has a bracket 290 that extends therefrom. The rear longitudinal support member 246 has a complementary bracket 292 thereon that aligns with bracket 290. A pivot rod 294 interconnects brackets 290, 294 such that brackets 290, 294 can pivot relative to one another about pivot rod 294. This engagement enables blowers 224 to be pivoted about pivot rod 294 between the first and second positions.

To facilitate the movement of blowers 224 between the first and second positions, a pair of assist mechanisms 296 can be coupled to each blower 224 and to structural assembly 236. Assist mechanisms 296 can be used to dampen the motion of blower 224 between the first and second positions and reduce the effort required to pivot blowers 224 between the first and second positions. Assist mechanism 296 can take a variety of forms. For example, in FIGS. 10-14, assist mechanism 296 is a gas strut. When assist mechanism 296 is a gas strut, a pair of assist mechanisms 296 can be associated with each blower 224 and can be connected to blower 224 and to lateral support members 248 of lower level 240 of structural assembly 236. Specifically, support members 248 can include one or more upwardly extending brackets 297 and blowers 224 can include a pair of brackets 298 that extends upwardly from the top surface of flange 250. One end of assist mechanism 296 is attached to bracket 297, while the opposite end of assist mechanism 296 is attached to bracket 298. During the pivoting of blower 224 between the first and second positions, assist mechanisms 296 will elongate/retract. The elongation and retraction of assist mechanisms 296 is dampened such that the effort to move blower 224 between the first and second positions is reduced. Additionally, assist mechanisms 296 can reduce the velocity at which blower 224 can move between the first and second positions. In this manner, assist mechanisms 296 can facilitate the movement of blowers 224 between the first and second positions.

Blowers 224 are installed in the conditioning unit 220 at the factory in the first raised position. In this position, blower 224 cannot be operated to draw an air flow through conditioning unit 220. Blowers 224 can, however, be tested when in this position. Thus, when manufacturing conditioning unit 220, blower 224 is installed in the first raised position and is connected to control system 226. Blowers 224 are secured in this position through the use of one or more fasteners that can engage with structural assembly 236 to prevent blowers 224 from moving from the first position. At the factory, operation of blowers 224 is checked prior to shipment. Specifically, as stated above with reference to conditioning unit 20, blowers 224 are connected to control system 226 and their operation is ascertained. Additionally, conditioning units 220 can be certified at the factory. Thus, conditioning unit 220 can be shipped to a purchaser/user as a certified unit with blowers 224 already connected to control system 226 of conditioning unit 220.

When conditioning unit 220 arrives in the computer room, conditioning unit 220 can be attached to a support frame 256. The fasteners retaining blowers 224 in the first position can then be removed and blower 224 pivoted about pivot rod 294 from the first position to the second operative lowered position. When in the second position, flange 250 resides on the upper surface of lower level 240 of structural assembly 236. Fasteners can then be utilized to secure flange 250 to lower level 240, as described above with reference to conditioning unit 20. During the movement of blowers 224 between the first and second positions, the connection of blowers 224 to control system 226 remains. As such, blowers 224 do not need to be disconnected and then reconnected with control system 226 to move between the first and second positions. Therefore, the installation and use of conditioning unit 220 is facilitated. If desired, blowers 224 can include a handle or other type of protrusion that can be easily gripped by the installer to facilitate the movement of blowers 224 between the first and second positions.

Figure 15:
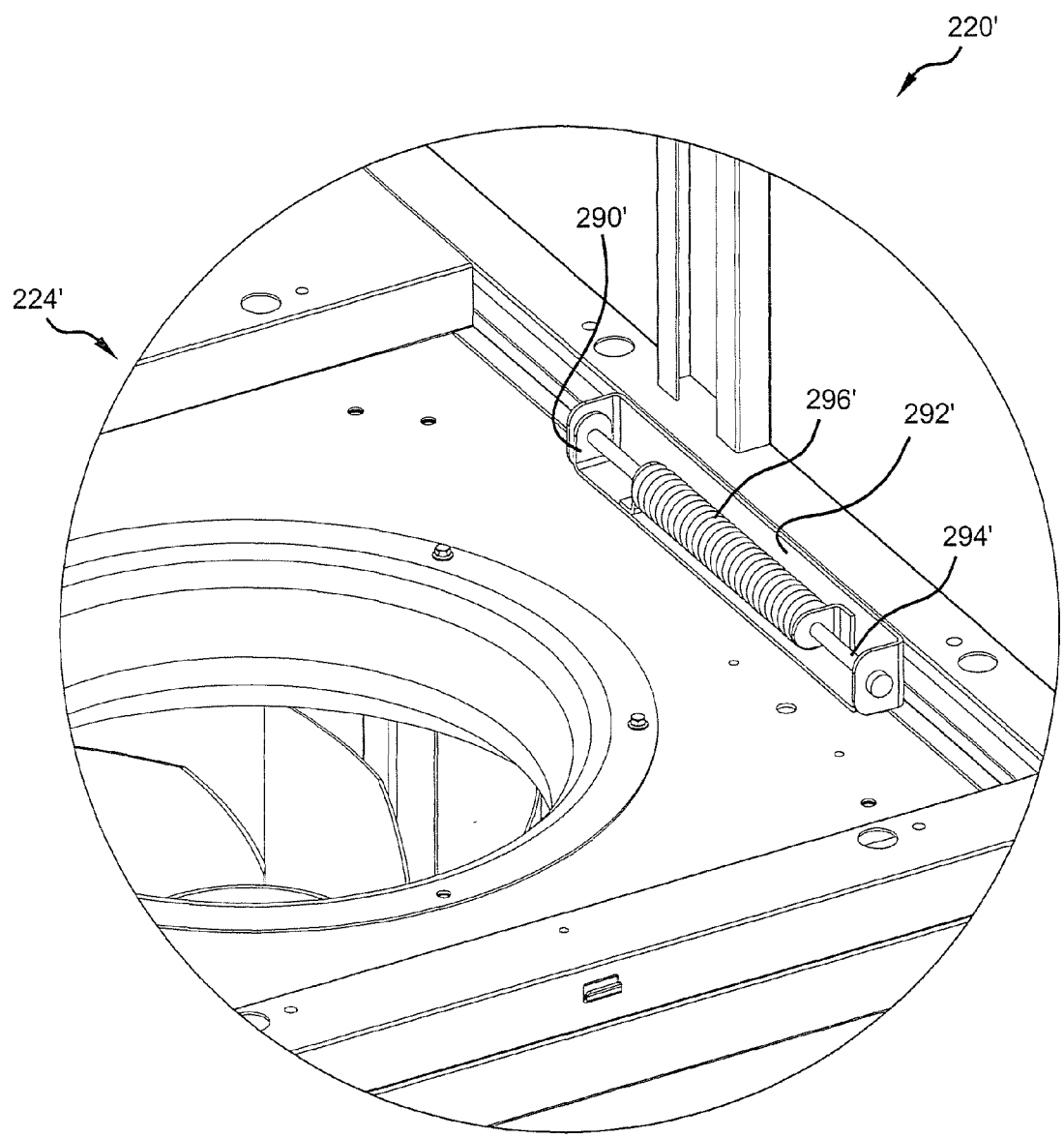
FIG. 15 is an enlarged fragmented perspective view of an alternate hinge configuration that can couple the blowers to the condition unit according to the present teachings wherein a torsion spring is utilized to assist with the movement of the blower between the first and second positions.

As stated above, the assist mechanism utilized in conditioning unit 220 can take a variety of forms. For example, as shown in FIG. 15, another assist mechanism 296' can be in the form of a torsion spring 296' which is wrapped around pivot rod 294'. Assist mechanism 296' can be disposed on pivot rod 294' with one end engaged with bracket 290' and the other end engaged with bracket 292'. Assist mechanism 296' is configured to resist movement of blower 224' from the first position to the second position. In this manner, assist mechanism 296' can facilitate the movement of blower 224' between the first and second positions.

Figure 16:
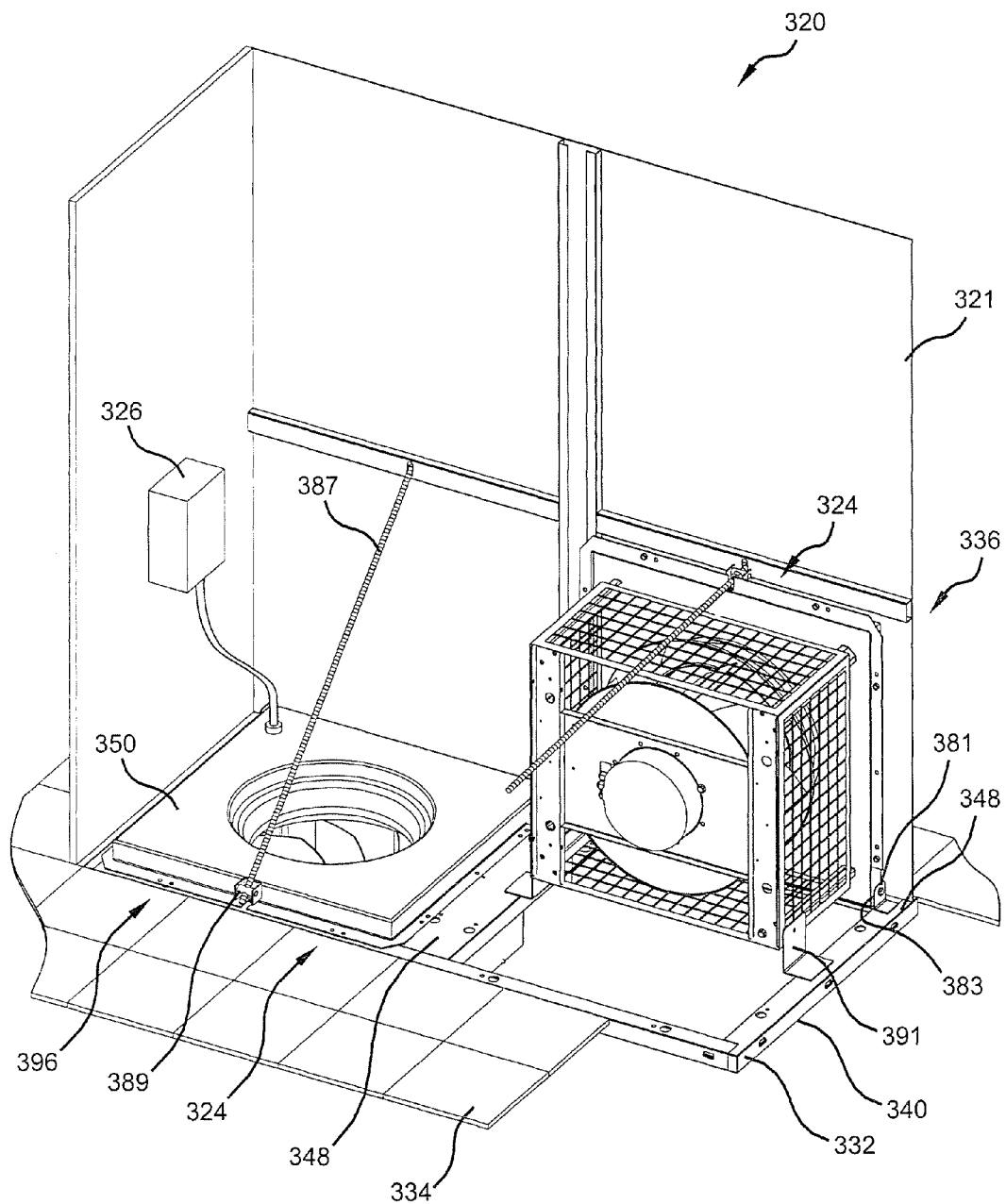
FIG. 16 is a fragmented perspective view of a fourth embodiment of a computer room environmental conditioning unit according to the present teachings wherein the blowers are pivoted between a first shipped position and a second operating position through the use of a threaded member.
Figure 17:
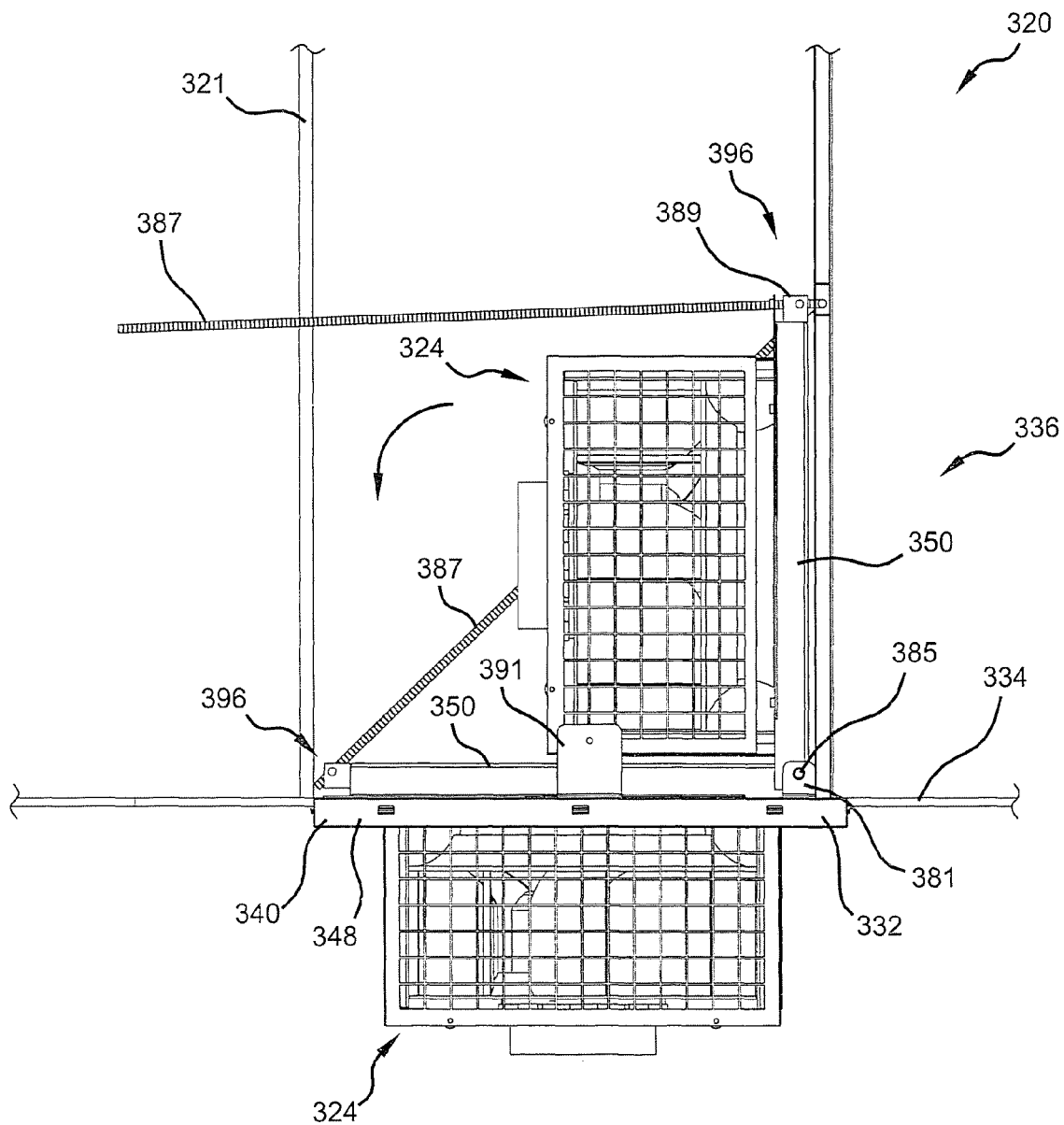
FIG. 17 is a fragmented side plan view of the conditioning unit of FIG. 16.

Referring now to FIGS. 16-17, a fourth embodiment of a computer room environmental conditioning unit 320 according to the present teachings is shown. Conditioning unit 320 is similar to conditioning unit 220 in that blowers 324 pivot between a first shipped (raised) position and a second (lowered) operating position. As such, all the details of conditioning unit 320 are not described herein.

In conditioning unit 320, lower level 340 of structural assembly 336 includes a plurality of hinge brackets 381 that engage with complementary hinge brackets 383 on flange 350 of blower 324. The engagement of hinge brackets 381, 383 allows blower 324 to rotate about pivot 385 between the first and second positions.

In conditioning unit 320, assist mechanism 396 includes a jacking screw 387 that is threadably engaged with a threaded pivot 389 on flange 350 of blower 324. An end of jacking screw 387 can extend into and/or through panel 321 such that jacking screw 387 is accessible from the exterior side of panel 321 of conditioning unit 320. Rotation of jacking screw 387 causes threaded pivot 389 to move along the length of jacking screw 387 and the associated blower 324 to move between the first and second positions, depending upon the direction of rotation of jacking screw 387.

Conditioning unit 320 is assembled at the factory with blowers 324 in the first shipped position. Shipping brackets 391 can be connected to the lower portion of blowers 324 and to lateral support members 348 of lower level 340 of structural assembly 336. Shipping brackets 391 maintain blowers 324 in the first position during shipment of conditioning unit 320. Additionally, blowers 324 are coupled to control system 326 and tested when in the first position at the factory. As such, conditioning unit 320 can be certified at the factory and shipped to the user/purchaser as a certified conditioning unit.

The conditioning unit 320 is installed in the computer room with bottom 332 generally aligned with raised floor 334. When conditioning unit 320 is being installed, shipping brackets 391 are removed therefrom and jacking screw 387 rotated to pivot blowers 324 from the first position to the second lowered and operative position. Fasteners can secure blowers 324 to lower level 340 when in the second position. When in the operative position, blowers 324 are in the space beneath raised floor 334. Blowers 324 do not need to be disconnected from control system 326 when being moved between the first and second positions. As such, movement of conditioning unit 320 is facilitated. The opposite steps can be performed to move blowers 324 from the second position to the first position.

Figure 18:
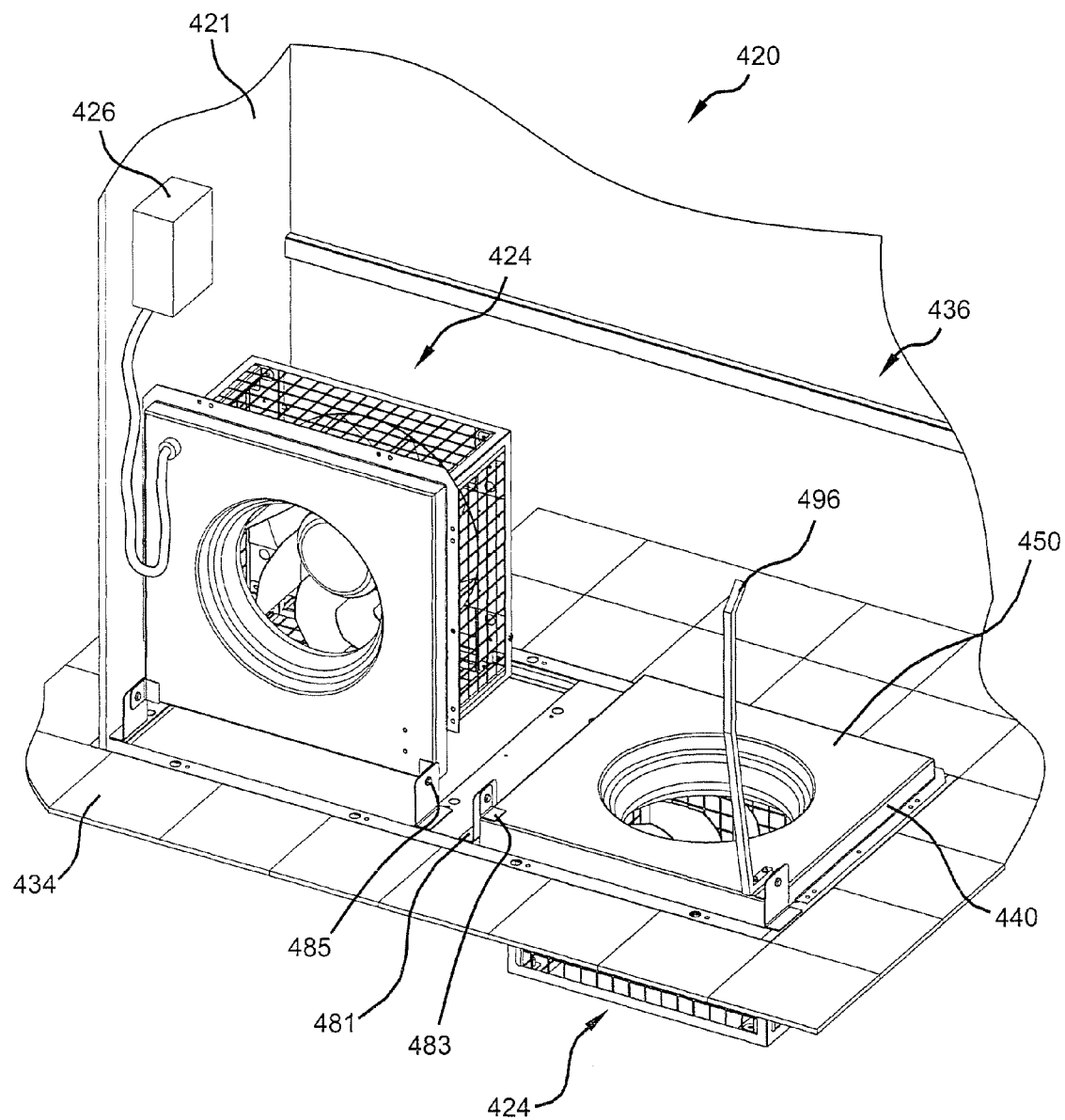
FIG. 18 is a fragmented perspective view of a fifth embodiment of a computer room environmental conditioning unit according to the present teachings wherein the blower is pivotable between a first shipped position and a second operating position through the use of a lever.

Referring now to FIG. 18, a fifth embodiment of a computer room environmental conditioning unit 420 according to the present teachings is shown. Conditioning unit 420 is similar to conditioning unit 320 described above. As such, not all details of conditioning unit 420 are described herein.

In conditioning unit 420, assist mechanism 496 is in the form of a lever that can be selectively secured to the top surface of flange 450 adjacent hinge bracket 483. Again, blowers 424 rotate about pivot 485 formed by the interaction of hinge brackets 481, 483. When conditioning unit 420 is assembled at the factory, blowers 424 are secured in the first raised position with shipping brackets (not shown). Additionally, blowers 424 are connected to control system 426 and the operation of blowers 424 is tested. As such, conditioning unit 420 can be shipped to a purchaser/user as a certified conditioning unit.

When installed in the computer room, one or more panels 421 are removed therefrom and assist mechanism/lever 496 is attached to flange 450 of a blower 424. The shipping brackets are then removed and the blower 424 is rotated about pivot 485 from the first position to the second position through the use of lever 496. When in the second position, flange 450 rests on lower level 340 of structural assembly 436. Blower 424 is then secured thereto with the appropriate fasteners, as described above. Lever 496 is removed from blower 424 and can be reused to move another blower between the first and second positions. During movement of blower 424 from the first position to the second position, blower 424 is not disconnected from control system 426. As such, movement of conditioning unit 420 is facilitated. To return blower 424 to the first position, the opposite steps can be performed.

Figure 19:
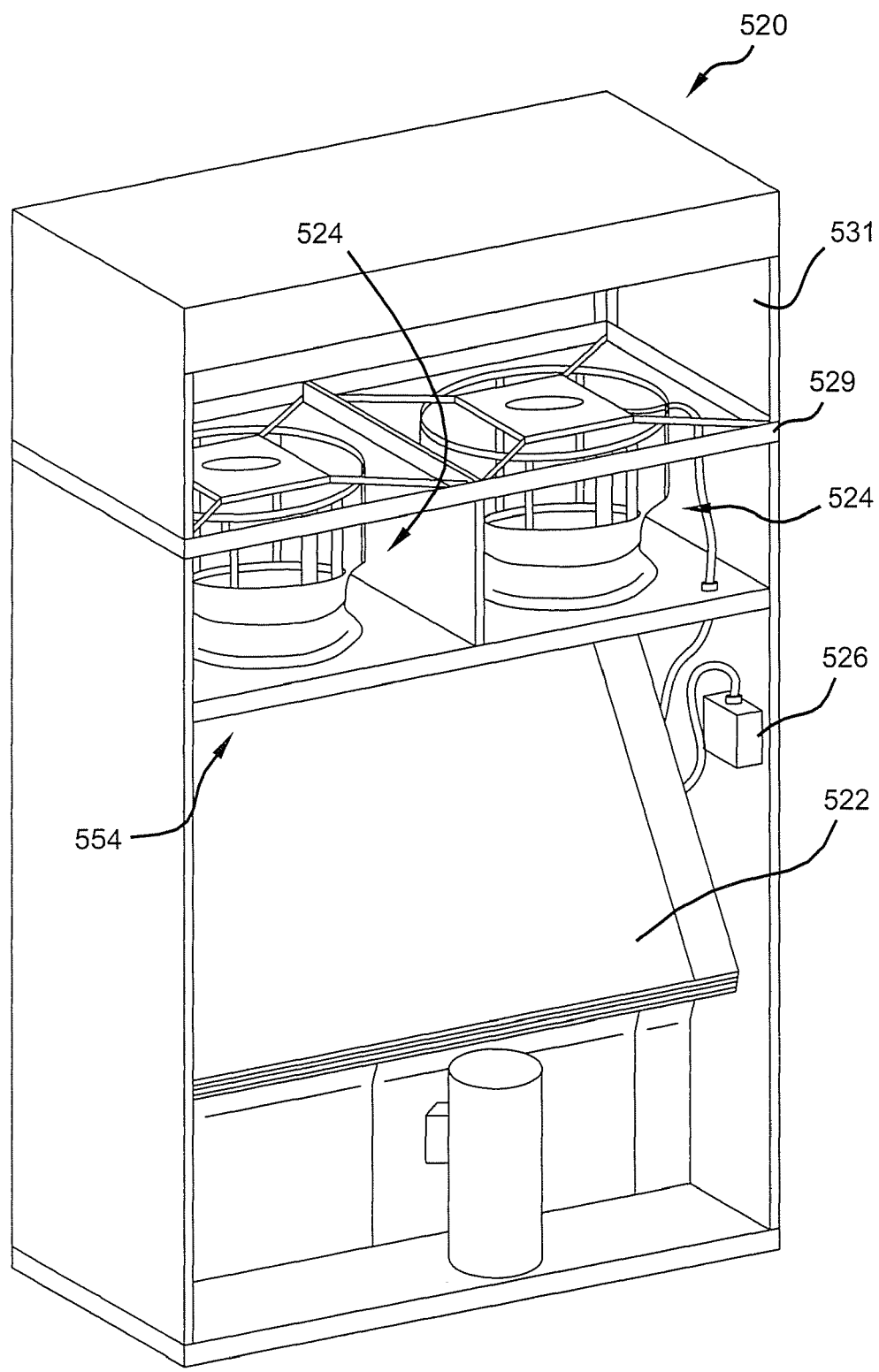
FIG. 19 is a perspective view of an up-flow computer room environmental conditioning unit according to the present teachings with the blower located in an upper part of the conditioning unit.
Figure 20:
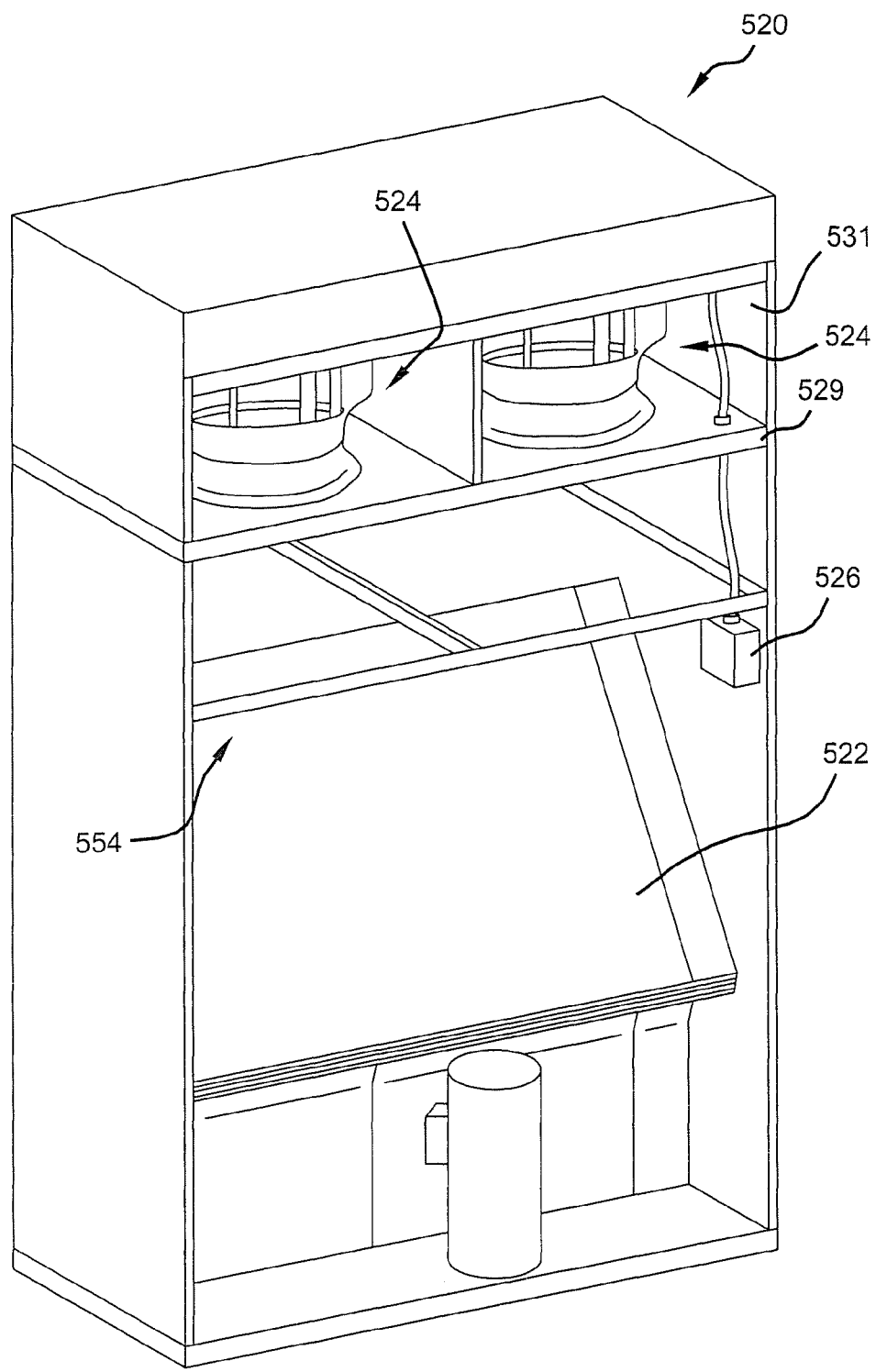
FIG. 20 is a perspective view of the conditioning unit of FIG. 19 with the blower moved to a position on top of the conditioning unit and a plenum (without a grill) attached thereto according to the present teachings.

Referring now to FIGS. 19 and 20, an up-flow computer room environmental conditioning unit 520 according to the present teachings is shown. Conditioning unit 520 is similar to the other conditioning units described herein. As such, all of the details of conditioning unit 520 will not be described herein. In conditioning unit 520, blowers 524 are installed in the upper portion of conditioning unit 520 and supported by support member assembly 554. In this configuration, blowers 524 are operable to pull air from the computer room into the lower part of conditioning unit 520, through heat exchanger 522, and exhaust the air through the top 529 of conditioning unit 520. Top 529 of conditioning unit 520 can be connected to appropriate duct work, such as a plenum 531 or other duct work, in the computer room to direct the flow of conditioned air to the desired locations.

Conditioning unit 520 is assembled at the factory with blowers 524 in the upper part of conditioning unit 520 and supported by support member assembly 554. At the factory, blowers 524 are connected to the control system 526 and operation of blowers 524 is tested. The testing also includes certifying the conditioning unit 520 as meeting the applicable rating standards. Thus, the conditioning unit 520, when shipped, is in an operating condition and can be placed in the computer room, electrical power connected to conditioning unit 520, and operation can commence. Accordingly, conditioning unit 520 can be shipped to a purchaser/user as a certified conditioning unit.

In some applications, the customer or purchaser of conditioning unit 520 may wish to move blowers 524 to a position above top 529 of conditioning unit 520. In these applications, discharge plenum 531 or other suitable duct work can be attached to top 529 of conditioning unit 520 to provide a desired cavity and discharge for blowers 524. Blowers 524 can be translated from the position in the upper part of conditioning unit 520, as shown in FIG. 19, to a position above top 529 of conditioning unit 520 and supported by top 529 of conditioning unit 520, as shown in FIG. 20. This can be accomplished without disconnecting blowers 524 from control system 526. Furthermore, because control system 526 is not disconnected from blowers 524, movement of blowers 524 is facilitated. Conditioning unit 520 can include discharge grills (not shown for clarity).

Blowers 524 are operable in both the first shipped position, as shown in FIG. 19, and in the second position shown in FIG. 20. Blowers 524 can be moved between the first and second positions in a variety of manners. For example, the mechanisms and arrangements discussed above with reference to conditioning units 20, 120, 220, 320, and 420 can be utilized to move blowers 524 between the first and second positions. In some of these applications, blowers 524 may be in a first non-operative and shipped position, as discussed above with reference to blowers that pivot between the first and second positions. Regardless of the mechanisms and arrangements utilized, the up-flowing conditioning unit 520 according to the present teachings can include blowers that are certified at the factory and can be moved between first and second positions when being installed.

Figure 21:
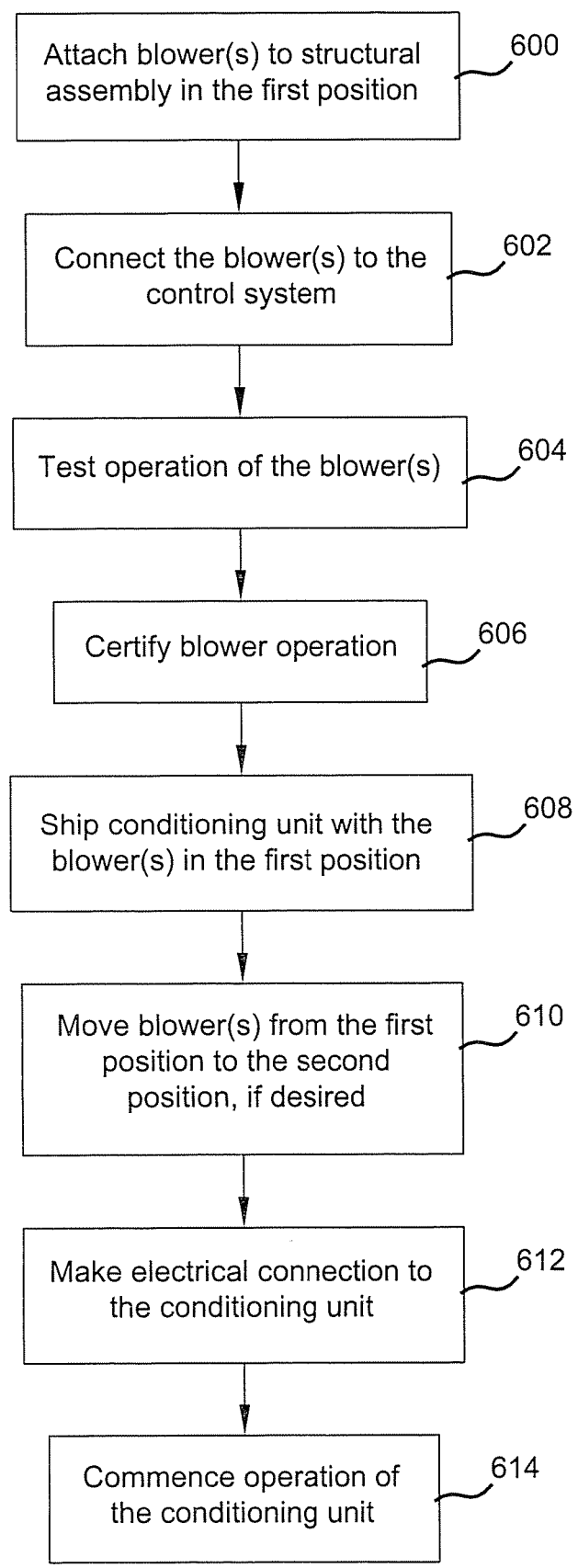
FIG. 21 is a flow chart illustrating the testing and installation procedures for a computer room environmental conditioning unit according to the present teachings.

Referring now to FIG. 21, a flow chart illustrating portions of the assembly, shipping, and installation of conditioning units according to the present teachings is shown. The conditioning units according to the present teachings are assembled at the factory by attaching the blower to the structural assembly with the blower in a first position, as indicated in block 600. As stated above, the attachment of the blower to the structural assembly can be accomplished with a variety of mechanizations and configurations. The attachment, however, regardless of configuration or mechanization can allow the blower to be translated between first and second positions, as discussed above with reference to the various embodiments. With the blower attached to the structural assembly, the blower is then connected to the control system, as indicated in block 602.

Operation of the blower is then tested, as indicated in block 604. As stated above, the testing of the operation of the blowers can include testing for the vibration level, the proper voltage, and the proper electrical connection, by way of non-limiting example. Additionally, the blowers can be certified for operation, as indicated in block 606. With the blower fully tested and certified, a certified conditioning unit can be shipped to a purchaser with the blower in the first position, as indicated in block 608.

The purchaser can then install the conditioning unit in the computer room. When installing the conditioning unit in the computer room, the blower can be moved from the first position to the second position, as desired, as indicated in block 610. As stated above, in some of the embodiments, the blower if operable in both the first and second positions while in other embodiments the first position is merely a shipping position and the blower must be moved the second position to be operational. Thus, in some applications the conditioning unit will be operated with the blowers in the first position, while in other applications the conditioning unit will be operated with the blowers in the second position. Because the movement of the blowers between the first and second positions does not require that the blowers be disconnected from the control system, movement of the blowers is facilitated.

With the blowers in the desired operational position, the electrical connections can be made to the conditioning unit, as indicated in block 612. Along with making the electrical connections, any other additional connections required to install the conditioning unit in the computer room can also be performed. With the conditioning unit electrically connected, operation of conditioning unit can commence, as indicated in block 614.

It should be appreciated that the preceding description of the assembly, testing, shipping, and installation of the conditioning unit does not include every step or detail associated therewith. Rather, the preceding description and illustration shown in FIG. 21 is merely representative of steps that are to be performed and are not all inclusive.

Thus, a computer room environmental conditioning unit according to the present teachings has one or more blowers that are translatable between first and second positions. In some embodiments, the blowers can move between first and second positions that are both operable. In other embodiments, the first position is a non-operable position, while the second position is an operable position. In all of the embodiments, the conditioning units and the blowers therein may be capable of having their operation checked and be certified when in the first position and can be shipped as a certified conditioning unit. When the blowers are subsequently moved between the first and second positions during installation in the computer room, the blowers remain connected to the control system and such movement is facilitated. Additionally, the various conditioning units disclosed herein provide a variety of mechanisms and arrangements to further facilitate moving of the blowers between the first and second positions. The ability to change the location of the blower can allow customization of the computer room within which the conditioning units are to be utilized. Additionally, this capability can reduce the number of different conditioning units or configurations that a manufacturer needs to supply to meet the variety of applications.

While the conditioning units are described herein by reference to specific examples and embodiments, it should be appreciated that changes and alterations to the embodiments disclosed can be made. For example, the various components and features of the different embodiments can be mixed and matched, as desired, to achieve a desired functionality. Moreover, other mechanisms or arrangements that provide similar functionality can also be employed. Thus, the specific examples, illustrations, and embodiments disclosed herein are merely representative in nature and changes and alterations to the embodiments shown should be considered to be within the scope of the claims.

What is claimed is:

1. A computer room environmental conditioning unit comprising:
   a structural assembly; and
   at least one blower operable to draw a flow of air through the conditioning unit, the at least one blower coupled to the structural assembly and operable to be moved between first and second positions relative to the structural assembly, the at least one blower being coupled to the structural assembly in both the first and second positions.

2. The computer room environmental conditioning unit of claim 1, wherein the first position is a shipped position.

3. The computer room environmental conditioning unit of claim 2, wherein the at least one blower is operable to draw a flow of air through the conditioning unit in both the first and second positions.

4. The computer room environmental conditioning unit of claim 2, wherein the at least one blower is operable to draw a flow of air through the conditioning unit in only the second position.

5. The computer room environmental conditioning unit of claim 1, wherein the at least one blower pivots between the first and second positions.

6. The computer room environmental conditioning unit of claim 5, further comprising at least one assist mechanism coupled to the at least one blower and operable to assist in the movement of the at least one blower between the first and second positions.

7. The computer room environmental conditioning unit of claim 6, wherein the at least one assist mechanism includes a gas strut having one end coupled to the blower and an opposite end coupled to the structural assembly.

8. The computer room environmental conditioning unit of claim 6, wherein the at least one assist mechanism includes a spring coupled to both the structural assembly and to the at least one blower, the spring biasing the at least one blower toward the first position.

9. The computer room environmental conditioning unit of claim 6, wherein the assist mechanism includes a threaded rod and a threaded pivot coupled to the at least one blower, the threaded rod engaged with the threaded pivot such that rotation of the threaded rod relative to the threaded pivot causes the at least one blower to move between the first and second positions.

10. The computer room environmental conditioning unit of claim 9, further comprising at least one panel coupled to the structural assembly and wherein an end of the threaded rod is accessible from an exterior of the at least one panel.

11. The computer room environmental conditioning unit of claim 6, wherein the at least one assist mechanism includes a lever selectively attachable to the at least one blower and wherein the lever provides a mechanical advantage in the movement of the at least one blower between the first and second positions.

12. The computer room environmental conditioning unit of claim 1, wherein the at least one blower is entirely contained within the conditioning unit when in the first position and extends outwardly beyond the conditioning unit when in the second position.

13. The computer room environmental conditioning unit of claim 12, wherein the at least one blower extends outwardly below the conditioning unit when in the second position.

14. The computer room environmental conditioning unit of claim 12, wherein the at least one blower extends outwardly above the conditioning unit when in the second position.

15. The computer room environmental conditioning unit of claim 1, wherein the at least one blower moves translationally between the first and second positions.

16. The computer room environmental conditioning unit of claim 15, wherein the translational movement of the at least one blower between the first and second positions is vertical translational movement.

17. The computer room environmental conditioning unit of claim 15, further comprising a jacking mechanism operable to move the at least one blower between the first and second positions.

18. The computer room environmental conditioning unit of claim 17, wherein the jacking mechanism engages with a motor of the at least one blower during movement between the first and second positions.

19. The computer room environmental conditioning unit of claim 17, further comprising a support frame operable to support the conditioning unit, the support frame including at least one rail aligned under the at least one blower and having an engaging feature that engages with the jacking mechanism, the jacking mechanism residing on the at least one rail and being engaged with the engaging feature when moving the at least one blower between the first and second positions.

20. The computer room environmental conditioning unit of claim 15, further comprising a jig assembly including first and second support members coupled together with a threaded member, the first support member selectively attachable to the structural assembly, the second support member selectively attachable to the at least one blower, and movement of the at least one blower between the first and second positions is caused by the support members moving relative to the threaded member.

21. The computer room environmental conditioning unit of claim 1, wherein the at least one blower includes a flange and the flange is secured to a first portion of the structural assembly from at least one of above and below when in the first position and is secured to a second portion of the structural assembly from at least one of above and below when in the second position.

22. The computer room environmental conditioning unit of claim 1, wherein the at least one blower remains coupled to the structural assembly during movement between the first and second positions.

23. The computer room environmental conditioning unit of claim 1, wherein the at least one blower is certified in the first position.

24. The computer room environmental conditioning unit of claim 1, further comprising a control system coupled to the at least one blower and operable to command operation of the at least one blower, and wherein the at least one blower remains connected to the control system during movement between the first and second positions.

25. The computer room environmental conditioning unit of claim 1, further comprising at least one guide member engaged with the at least one blower, the at least one guide member guiding movement of the at least one blower between the first and second positions.

26. A method comprising:
coupling at least one blower to a structural assembly of a computer room environmental conditioning unit, the at least one blower being coupled to the structural assembly in a first position and operable to be moved to a second position different than the first position and being coupled to the structural assembly in both of the first and second positions;
connecting the at least one blower to a control system of the conditioning unit;
shipping the conditioning unit to an installation site with the at least one blower in the first position and connected to the control system;
positioning the at least one blower in one of the first and second positions at the installation site;
installing the conditioning unit in a computer room at the installation site; and
operating the at least one blower.

27. The method of claim 26, further comprising testing operation of the at least one blower while in the first position and certifying the conditioning unit prior to shipping the conditioning unit.

28. The method of claim 26, wherein the first position is a shipping position not suitable for operation of the conditioning unit to condition the air of a computer room and positioning the at least one blower includes moving the at least one blower from the first position to the second position at the installation site.

29. The method of claim 28, wherein moving the blower includes pivoting the at least one blower between the first and second positions.

30. The method of claim 26, wherein positioning the at least one blower includes moving the at least one blower translationally between the first and second positions.

31. The method of claim 26, wherein positioning the at least one blower includes maintaining the at least one blower connected to the control system during movement between the first and second positions.

32. The method of claim 26, wherein operating the at least one blower includes operating the at least one blower in either of the first and second positions.

33. The method of claim 26, wherein operating the at least one blower includes operating the at least one blower in only the second position.

* * * * *